US010629520B2

(12) United States Patent
Haga

(10) Patent No.: US 10,629,520 B2
(45) Date of Patent: Apr. 21, 2020

(54) SEMICONDUCTOR DEVICE AND METHOD FOR MANUFACTURING THE SAME

(71) Applicant: Rohm Co., Ltd., Kyoto-shi, Kyoto (JP)

(72) Inventor: Motoharu Haga, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/989,468

(22) Filed: May 25, 2018

(65) Prior Publication Data
US 2018/0342442 A1 Nov. 29, 2018

(30) Foreign Application Priority Data

May 29, 2017 (JP) .................. 2017-105182
Jun. 22, 2017 (JP) .................. 2017-122023
Apr. 27, 2018 (JP) .................. 2018-087093

(51) Int. Cl.
*H01L 23/00* (2006.01)
*H01L 23/495* (2006.01)

(52) U.S. Cl.
CPC .... *H01L 23/4952* (2013.01); *H01L 23/49524* (2013.01); *H01L 23/49562* (2013.01); *H01L 23/49575* (2013.01); *H01L 24/48* (2013.01); *H01L 24/49* (2013.01); *H01L 24/85* (2013.01); *H01L 24/45* (2013.01);
(Continued)

(58) Field of Classification Search
CPC ............ H01L 23/29; H01L 23/49524; H01L 23/49562; H01L 23/49575; H01L 24/49; H01L 24/45; H01L 24/48; H01L 24/85; H01L 2224/8502; H01L 2224/48247; H01L 2224/48455; H01L 2224/4845; H01L 2224/48147; H01L 2224/4903; H01L 2224/45124; H01L 2224/45144; H01L 2224/45147; H01L 2224/85205; H01L 2224/85035; H01L 2224/45014; H01L 2224/32245; H01L 2224/48471; H01L 2224/48472; H01L 2224/49505; H01L 2224/73265; H01L 2224/78301; H01L 2924/00014; H01L 2924/13055;
(Continued)

(56) References Cited

U.S. PATENT DOCUMENTS

2013/0264697 A1* 10/2013 Notsu .............. H01L 23/48 257/690
2016/0233151 A1* 8/2016 Ichikawa ......... H01L 23/49582
2018/0277463 A1* 9/2018 Zhang ............. H01L 23/49513

FOREIGN PATENT DOCUMENTS

JP 2003209132 A 7/2003
JP 2012059927 A 3/2012

* cited by examiner

*Primary Examiner* — Chuong A Luu
(74) *Attorney, Agent, or Firm* — Hamre, Schumann, Mueller & Larson, P.C.

(57) ABSTRACT

A semiconductor device provided according to an aspect of the present disclosure includes a semiconductor element, a bonding target, a first wire, a wire strip and a second wire. The bonding target is electrically connected to the semiconductor element. The first wire is made of a first metal. The first wire includes a first bonding portion bonded to the bonding target and a first line portion extending from the first bonding portion. The wire strip is made of the first metal. The wire strip is bonded to the bonding target. The second wire is made of a second metal different from the first metal. The second wire includes a second bonding portion bonded to the bonding target via the wire strip and a second line portion extending from the second bonding portion.

23 Claims, 28 Drawing Sheets

(52) U.S. Cl.
CPC .............. *H01L 2224/32245* (2013.01); *H01L 2224/45014* (2013.01); *H01L 2224/45015* (2013.01); *H01L 2224/45124* (2013.01); *H01L 2224/45144* (2013.01); *H01L 2224/45147* (2013.01); *H01L 2224/4845* (2013.01); *H01L 2224/48137* (2013.01); *H01L 2224/48147* (2013.01); *H01L 2224/48247* (2013.01); *H01L 2224/48455* (2013.01); *H01L 2224/48471* (2013.01); *H01L 2224/48472* (2013.01); *H01L 2224/4903* (2013.01); *H01L 2224/49505* (2013.01); *H01L 2224/73265* (2013.01); *H01L 2224/78301* (2013.01); *H01L 2224/8502* (2013.01); *H01L 2224/85035* (2013.01); *H01L 2224/8592* (2013.01); *H01L 2224/85186* (2013.01); *H01L 2224/85205* (2013.01); *H01L 2924/00014* (2013.01); *H01L 2924/13055* (2013.01); *H01L 2924/13091* (2013.01); *H01L 2924/181* (2013.01)

(58) Field of Classification Search
CPC ..... H01L 2924/13091; H01L 2924/181; H01L 23/00; H01L 23/495; H01L 23/4952
USPC ......................................................... 257/666
See application file for complete search history.

FIG.10
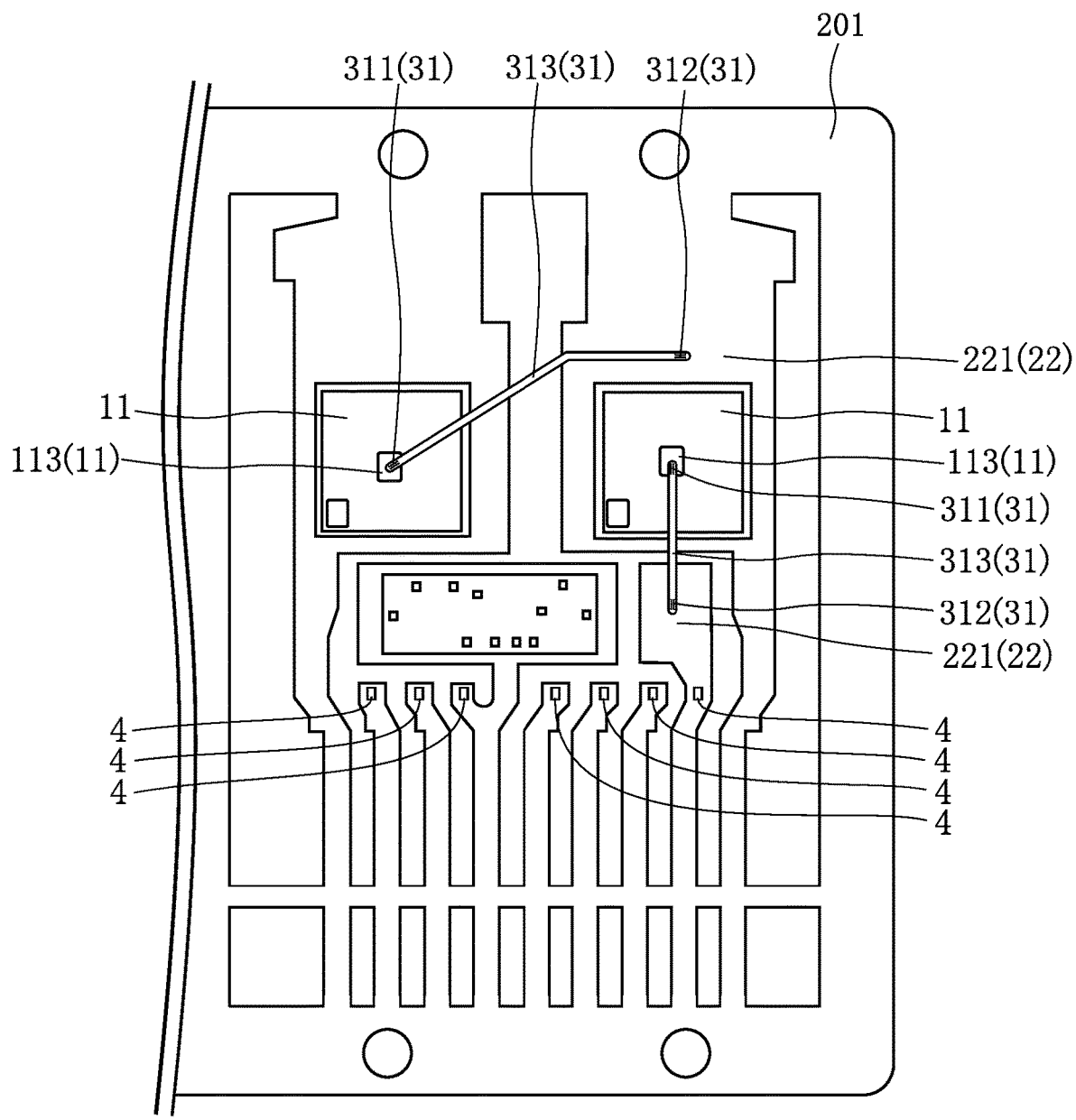
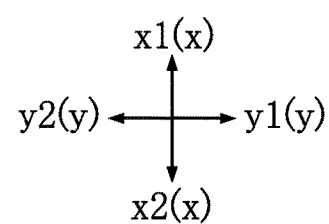

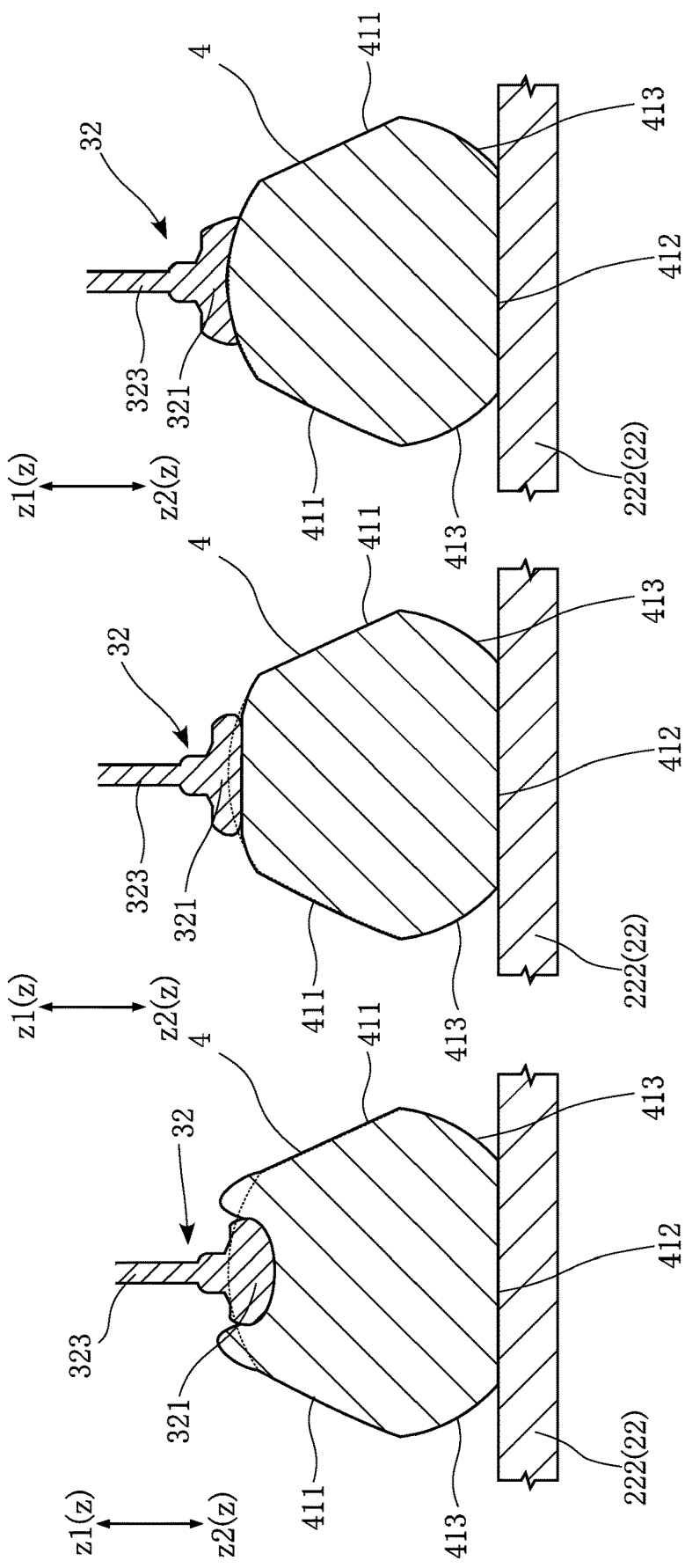
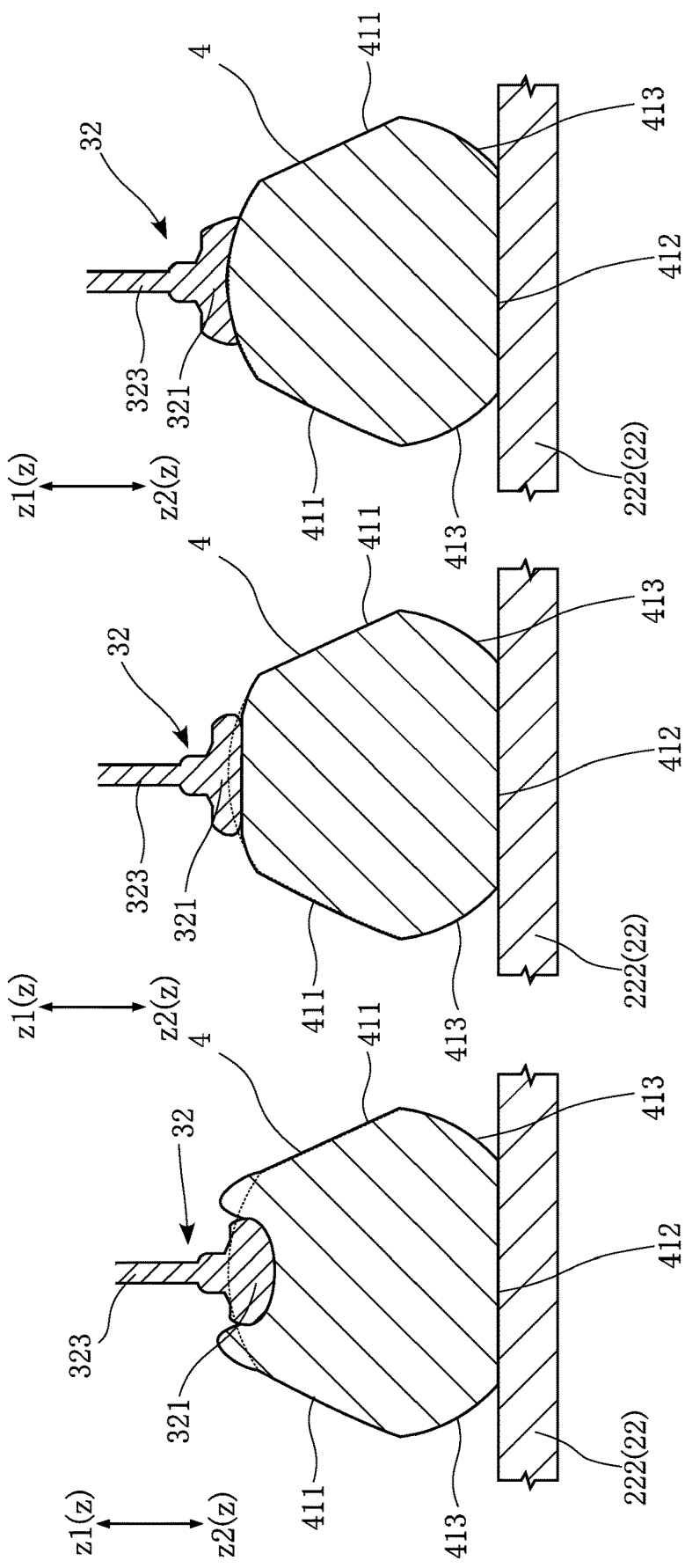
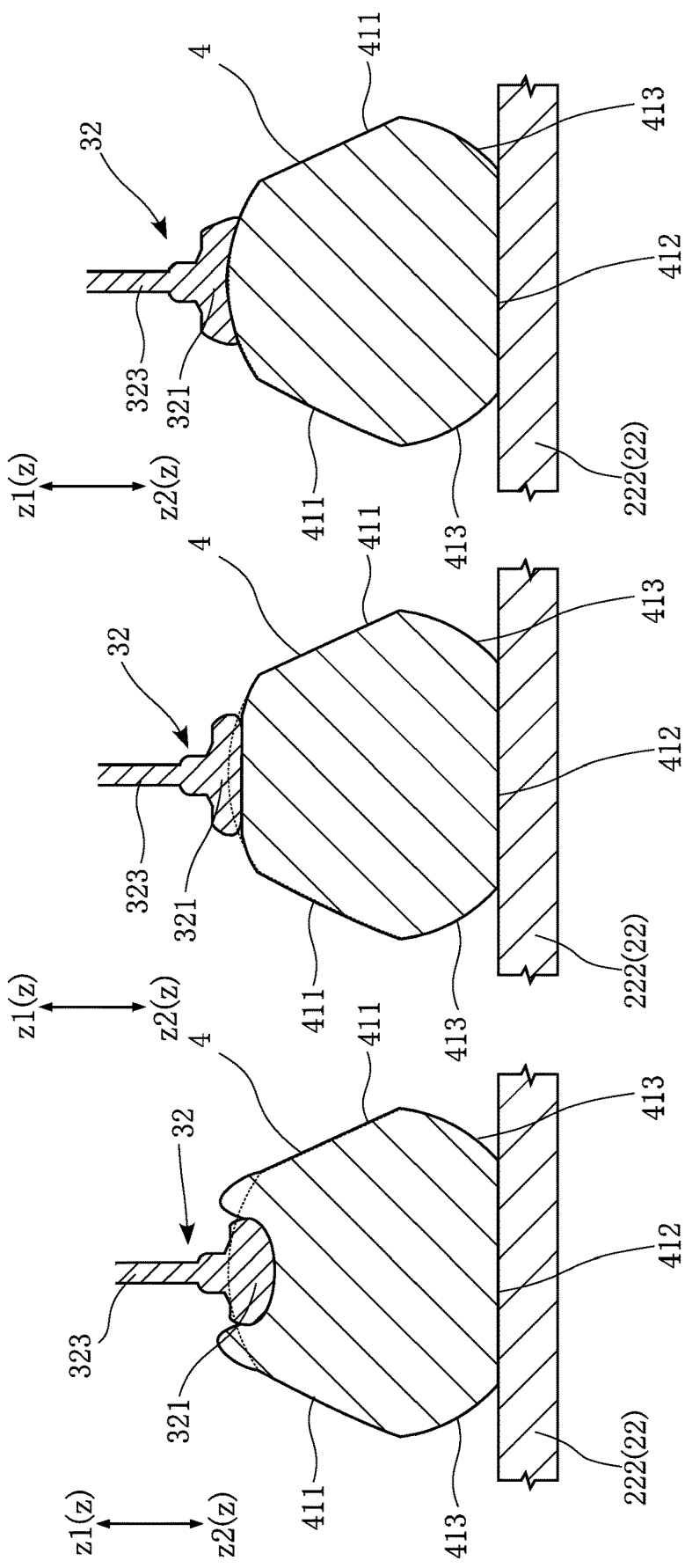

FIG.25
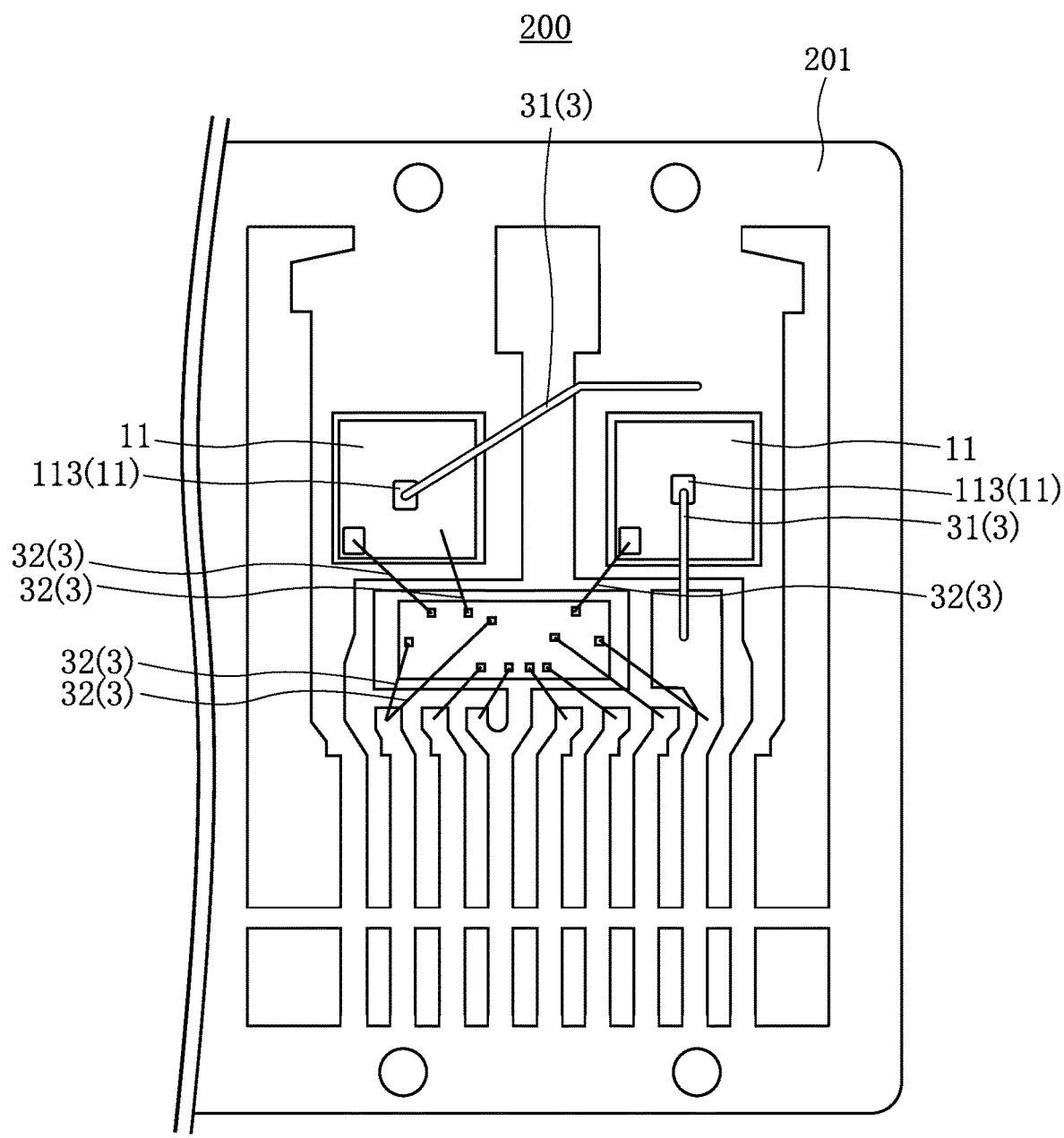
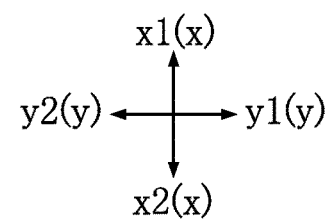

SEMICONDUCTOR DEVICE AND METHOD FOR MANUFACTURING THE SAME

FIELD

The present disclosure relates to a semiconductor device that uses a wire and a method for manufacturing such a semiconductor device.

BACKGROUND

An example of a conventional semiconductor device includes a lead frame, a semiconductor element and a plurality of wires.

SUMMARY

According to a first aspect of the present disclosure, a semiconductor device is provided. The semiconductor device includes a semiconductor element, a bonding target, a first wire, a wire strip and a second wire. The bonding target is electrically connected to the semiconductor element. The first wire is made of a first metal. The first wire includes a first bonding portion bonded to the bonding target and a first line portion extending from the first bonding portion. The wire strip is made of the first metal. The wire strip is bonded to the bonding target. The second wire is made of a second metal different from the first metal. The second wire includes a second bonding portion bonded to the bonding target via the wire strip and a second line portion extending from the second bonding portion.

According to a second aspect of the present disclosure, a method for manufacturing a semiconductor device is provided. The manufacturing method includes forming a wire strip by bonding a part of a first wiring material to a bonding target, and the first wiring material is made of a first metal. The method includes forming a first wire by using the first wiring material, and the first wire includes a first bonding portion bonded to the bonding target and a first line portion extending from the first bonding portion. The method includes forming a second wire by using a second wiring material made of a second metal different from the first metal, and the second wire includes a second bonding portion bonded to the wire strip and a second line portion extending from the second bonding portion.

BRIEF DESCRIPTION OF THE DRAWINGS

FIG. 10 shows a step of a manufacturing method according to an embodiment of the present disclosure;

FIGS. 13A-13C are sectional views showing a wire bonding structure according to an embodiment of the present disclosure;

FIG. 25 shows a step of the method for manufacturing the semiconductor device according to an embodiment of the present disclosure;

DESCRIPTION OF THE EMBODIMENTS

Embodiments of the present disclosure will be described below with reference to the accompanying drawings.

Figure 1:
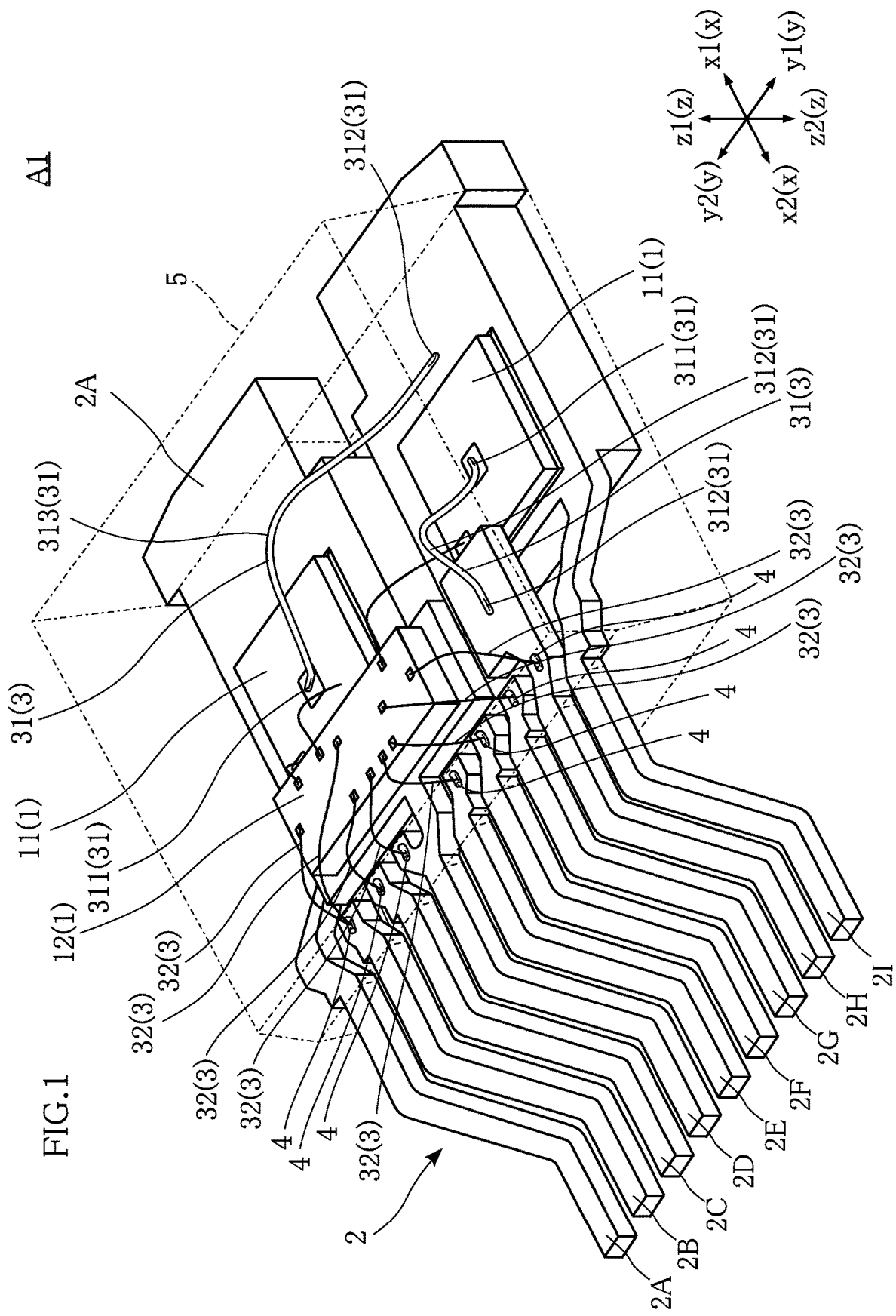
FIG. 1 is a perspective view showing a semiconductor device according to an embodiment of the present disclosure.
Figure 2:
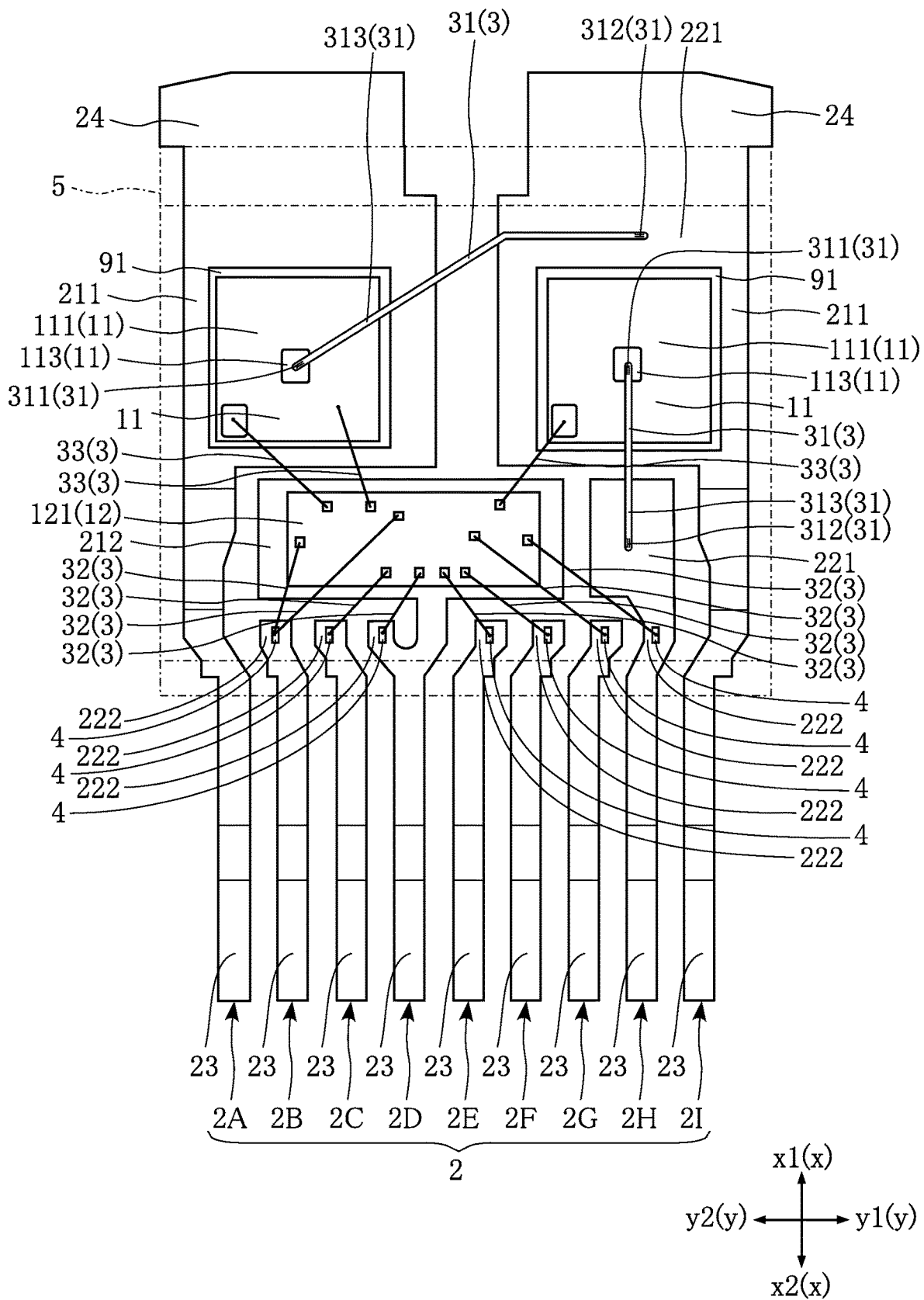
FIG. 2 is a plan view showing the semiconductor device according to an embodiment of the present disclosure.
Figure 3:
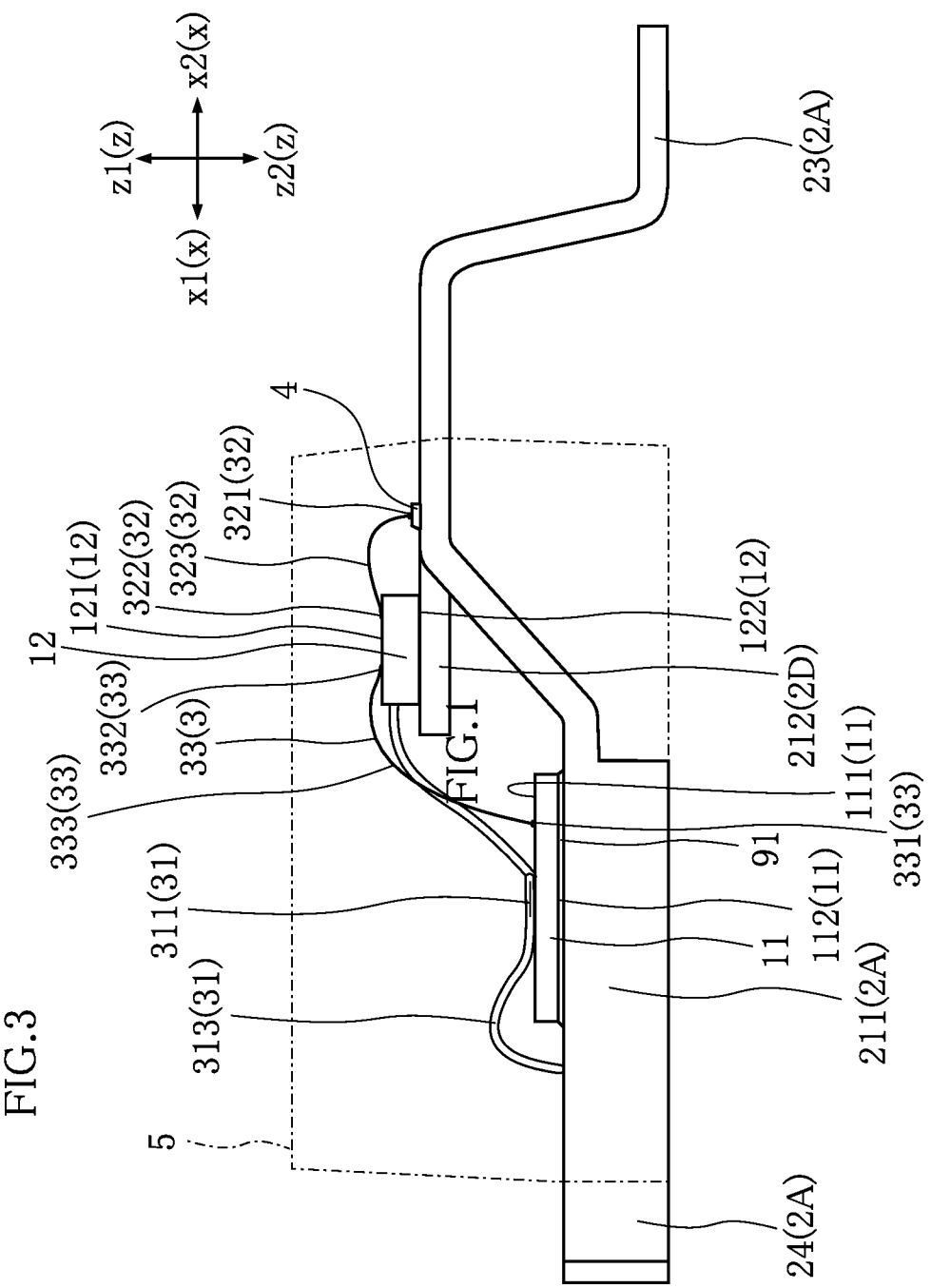
FIG. 3 is a side view showing the semiconductor device according to an embodiment of the present disclosure.
Figure 4:
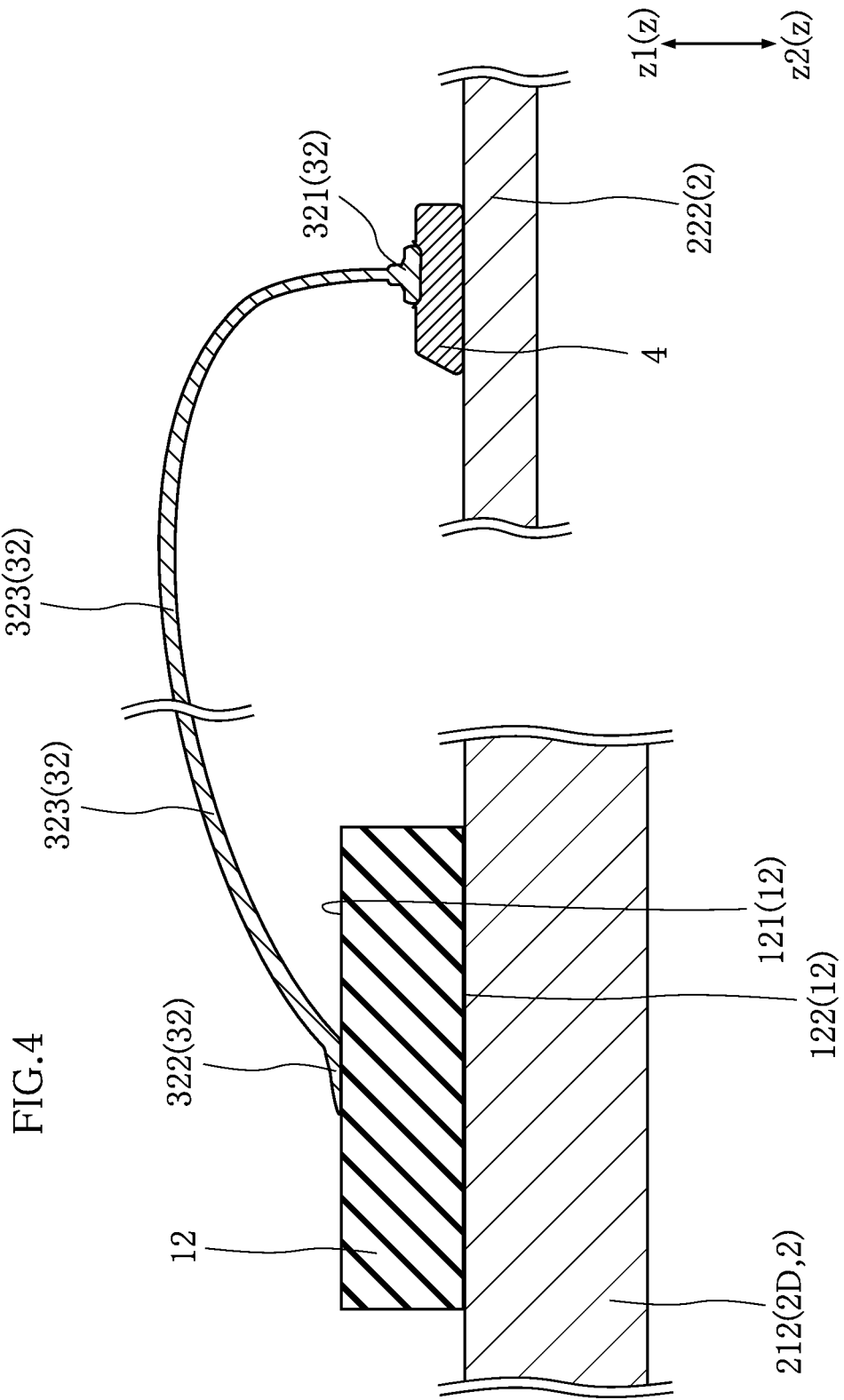
FIG. 4 is an enlarged sectional view showing a part of the semiconductor device according to an embodiment of the present disclosure.

FIGS. 1-4 show a semiconductor device A1 according to an embodiment of the present disclosure. The semiconductor device A1 of the present disclosure may be mounted on an electrical circuit board for automobiles or electronic equipment. The semiconductor device A1 includes a plurality of semiconductor chips 1, a lead frame 2, and a plurality of wires 3, a wire strip 4 and a resin package 5. FIG. 1 is a perspective view of the semiconductor device A1. FIG. 2 is a plan view of the semiconductor device A1. FIG. 3 is a side view of the semiconductor device A1, showing the side surface as viewed from the left side in FIG. 2. FIG. 4 is an enlarged sectional view showing a part of the semiconductor device A1. In FIGS. 1-3, the resin package 5 is shown by phantom lines. In FIG. 4, illustration of the resin package 5 is omitted. For convenience of understanding, the following description will be made with reference to an orthogonal coordinate system defined by an x direction, a y direction, and a z direction that are orthogonal to each other. The z direction corresponds to the thickness direction of the semiconductor device A1.

Each of the semiconductor chips 1 is a circuit element made of a semiconductor material and an electronic component that can perform the main function of the semiconductor device A1. In the present embodiment, the semiconductor device A1 includes a plurality of first semiconductor chips 11 and a second semiconductor chip 12, as the plurality of semiconductor chips 1.

Each of the first semiconductor chips 11 is rectangular as viewed in plan. For example, each of the first semiconductor chips 11 is a power chip such as IGBT (Insulated Gate Bipolar Transistor), a MOSFET (Metal Oxide Semiconductor Field Effect Transistor) or a diode. However, each of the semiconductor chips 11 is not limited to those described above. In the present embodiment, the semiconductor device A1 includes two first semiconductor chips 11. Each first semiconductor chip 11 includes a chip obverse surface 111 and a chip reverse surface 112. The chip obverse surface 111 faces in the z1 direction. The chip reverse surface 112 faces in the z2 direction. Each of the first semiconductor chips 11 has an electrode pad 113.

Each electrode pad 113 is made of pure aluminum. Each electrode pad 113 may be an aluminum alloy. Each electrode pad 113 includes a pad obverse surface 113a, a pad reverse surface 113b and pad side surfaces 113c. The pad obverse surface 113a faces in the z1 direction. In the present embodiment, the pad obverse surface 113a is rectangular as viewed in plan. The pad reverse surface 113b faces in the z2 direction. The pad side surfaces 113c include a surface facing in the x1 direction, a surface facing in the x2 direction, a surface facing in the y1 direction, and a surface facing in the y2 direction. In each of the first semiconductor chips 11, the pad obverse surface 113a forms a part of the chip obverse surface 111. That is, the pad obverse surface 113a and the chip obverse surface 111 are at the same position in the z direction. Note, however, that the pad obverse surface 113a and the chip obverse surface 111 may be at different positions in the z direction. A wire 3 (first wire 31 described later) is bonded to each pad obverse surface 113a.

The second semiconductor chips 12 is rectangular as viewed in plan. For example, the second semiconductor chip 12 is an LSI chip such as a control IC. However, the second semiconductor chip 12 is not limited to this. In the present embodiment, the semiconductor device A1 has a single second semiconductor chip 12. The second semiconductor chip 12 includes a chip obverse surface 121 and a chip reverse surface 122. The chip obverse surface 121 faces in the z1 direction. The chip reverse surface 122 faces in the z2 direction. A plurality of wires 3 (second wires 32 and third wires 33 described later) are bonded to the chip obverse surface 121. More specifically, the chip obverse surface 121 has electrode pads, and the plurality of wires 3 are bonded to the electrode pads. Examples of the material for the outermost layer of each electrode pad include aluminum, nickel/palladium, and nickel/palladium/gold but are not limited to these.

The lead frame 2 is made of an electrically conductive material. Examples of such an electrically conductive material include Cu. The lead frame 2 is bonded to an electrical circuit board, forming a conduction path between the semiconductor chips 1 and the electrical circuit board. All of the surfaces of the lead frame 2 are plated with Ni. The lead frame 2 corresponds to an example of the "bonding target". The lead frame 2 includes a plurality of die bonding portions 21, a plurality of wire bonding portions 22, a plurality of terminal portions 23, and a plurality of heat dissipating portions 24.

The die bonding portions 21 support the semiconductor chips 1, respectively. Each of the die bonding portions 21 has a plate-like shape along the x-y plane. In the present embodiment, the die bonding portions 21 include a plurality of first die bonding portions 211 and a second die bonding portion 212.

On each of the first die bonding portions 211, a first semiconductor chip 11 is bonded. As viewed in the z direction, each of the first die bonding portions 211 is larger than the outline of the first semiconductor chip 11. In the present embodiment, the lead frame 2 has two first die bonding portions 211. On the second die bonding portion 212, the second semiconductor chip 12 is bonded. As viewed in the z direction, the second die bonding portion 212 is larger than the outline of the second semiconductor chip 12. In the present embodiment, the lead frame 2 has the single second die bonding portion 212. The second die bonding portion 212 is positioned in the z1 direction relative to each first die bonding portion 211.

In the present embodiment, a bonding layer 91 is interposed between each of the first die bonding portions 211 and the first semiconductor chip 11 supported by the first die bonding portion. The bonding layer 91 is made of an electrically conductive material. For example, the electrically conductive material may be solder or silver paste. Solder has a relatively large thermal conductivity. Using solder for the bonding layer 91 allows heat to be efficiently conducted from the first semiconductor chip 11 to the first die bonding portion 211. Though not illustrated, a predetermined bonding layer is also interposed between the second die bonding portion 212 and the second semiconductor chip 12 supported by the second die bonding portion 212.

The wire bonding portions 22 support the wires 3, respectively. In the present embodiment, the wire bonding portions 22 include a plurality of first wire bonding portions 221 and a plurality of second wire bonding portions 222.

On each of the first wire bonding portions 221, a first wire 31 (described later) is bonded. In the present embodiment, the lead frame 2 has two first wire bonding portions 221. On each of the second wire bonding portions 222, a wire strip 4 is bonded. Each second wire bonding portion 222 is electrically connected to a second wire 32 (described later) via the wire strip 4 bonded on it. In the present embodiment, since plating is applied to the entirety of the lead frame 2 as described above, each first wire bonding portion 221 and each second wire bonding portion 222 has a plated surface facing in the z1 direction. In the present embodiment, the lead frame 2 has seven second wire bonding portions 222. The first wire bonding portions 221 correspond to an example of the "first bonding target portion". The second wire bonding portions 222 correspond to an example of the "second bonding target portion".

The plurality of terminal portions 23 are terminals for providing electrical connection to an electrical circuit board. That is, the terminal portions 23 function as connector pins of the semiconductor device A1. Each of the terminal portions 23 is exposed from the resin package 5. The terminal portions 23 are arranged side by side in the y direction. The terminal portions 23 are positioned in the x2 direction relative to the resin package 5. Each terminal portion 23 is bent. In the present embodiment, the lead frame 2 has nine terminal portions 23.

Each of the heat dissipating portions 24 functions to dissipate heat generated at the semiconductor chip 1 to the outside. Each heat dissipating portion 24 is exposed from the resin package 5. In the present embodiment, each heat dissipating portion 24 is connected to a corresponding first die bonding portion 211. As viewed in plan, the heat dissipating portions 24 are arranged side by side in the y direction and positioned in the x1 direction relative to the resin package 5. In the present embodiment, since the first semiconductor chips 11 are power chips, they generate a large amount of heat. Thus, the heat dissipating portions 24 are provided to dissipate the heat generated mainly at the first semiconductor chips 11. In the present embodiment, the lead frame 2 has two heat dissipating portions 24. The heat dissipating portions 24 may be part of the lead frame 2 or may be a different member bonded to the lead frame 2.

The lead frame 2 includes a plurality of leads. In the present embodiment, the semiconductor device A1 includes, as the lead frame 2, nine leads (a first to a ninth leads 2A-2I) separate from each other.

The first lead 2A has a terminal portion 23, a first die bonding portion 211 and a heat dissipating portion 24, which are connected to and integrally formed with each other. As shown in FIGS. 1 and 3, the first lead 2A is bent at a portion connecting the terminal portion 23 and the first die bonding portion 211 to each other. The first lead 2A supports a first semiconductor chip 11.

The second lead 2B includes a terminal portion 23 and a second wire bonding portion 222, which are connected to and integrally formed with each other. A second wire 32 is bonded to the second lead 2B via a wire strip 4. The third lead 2C, the fifth lead 2E, the sixth lead 2F and the seventh lead 2G are similar to the second lead 2B.

The fourth lead 2D has a terminal portion 23, a second wire bonding portion 222 and the second die bonding portion 212, which are connected to and integrally formed with each other. The fourth lead 2D supports the second semiconductor chip 12. A second wire 32 is bonded to the fourth lead 2D via a wire strip 4.

The eighth lead 2H has a terminal portion 23, a first wire bonding portion 221, and a second wire bonding portion 222, which are connected to and integrally formed with each other. A first wire 31 is bonded to the eighth lead 2H, and a second wire 32 is also bonded to the eighth lead 2H via a wire strip 4.

The ninth lead 2I includes a terminal portion 23, a first die bonding portion 211, a first wire bonding portion 221 and a heat dissipating portion 24, which are connected to and integrally formed with each other. As shown in FIGS. 1 and 3, the ninth lead 2I is bent at a portion that connects the terminal portion 23 and the first die bonding portion 211. The ninth lead 2I supports a first semiconductor chip 11. A first wire 31 is bonded to the ninth lead 2I.

Each of the wires 3 connects two of the first semiconductor chips 11, the second semiconductor chip 12, and the lead frame 2. In the present embodiment, the wires 3 include a plurality of first wires 31, a plurality of second wires 32 and a plurality of third wires 33.

Each of the first wires 31 is mainly composed of a first metal. Each of the second wires 32 and each of the third wires 33 is mainly composed of a second metal. The first metal is a material that has a relatively high bonding strength in metal bonding with the lead frame 2 as a bonding target.

The second metal is a material that has a relatively low bonding strength in metal bonding with the lead frame 2 as a bonding target, but has a sufficient bonding strength in metal bonding with the first metal. In the present embodiment, the lead frame 2 is plated with Ni, so that the first metal and the second metal may be selected based on the compatibility with Ni for the metal bonding. Examples of such a first metal include a metal mainly composed of aluminum, and examples of such a second metal include a metal mainly composed of gold or copper. In the present embodiment, each of the first wires 31 is made of an aluminum alloy to which one of iron, silicon and nickel is added. Each first wire 31 may be made of pure aluminum. In the present embodiment, both of the second wires 32 and the third wires 33 are made of gold.

Each of the first wires 31 has one end bonded to a first semiconductor chip 11 and the other end bonded to the lead frame 2. Each of the first wires 31 is made with a wedge tool 6 described later. In the present embodiment, the semiconductor device A1 has two first wires 31. Each of the first wires 31 includes a pair of wedge bonding portions 311 and 312 and a first line portion 313.

The paired wedge bonding portions 311 and 312 are the portions formed by wedge bonding using a wedge tool 6. The wedge bonding portion 311 is bonded to a first semiconductor chip 11 (electrode pad 113). The wedge bonding portion 312 is bonded to the lead frame 2 (first wire bonding portion 221). The first line portion 313 is a portion connecting the wedge bonding portion 311 and the wedge bonding portion 312. The first line portion 313 extends from each of the paired wedge bonding portions 311 and 312. The first line portion 313 is circular in cross section perpendicular to the longitudinal direction and has a diameter of 300 to 400 μm. That is, the wire diameter of each first wire 31 is 300 to 400 μm. However, the wire diameter of each first wire 31 is not limited to this. In the present embodiment, the wedge bonding portion 312 corresponds to an example of the "first bonding portion".

Each of the second wires 32 has one end bonded to the lead frame 2 (second wire bonding portion 222) via a wire strip 4 and the other end bonded to the second semiconductor chip 12 (chip obverse surface 121). Each of the second wires 32 is made with a capillary 7 described later. In the present embodiment, the semiconductor device A1 has eight second wires 32. Each of the second wires 32 includes a ball bonding portion 321, a stitch bonding portion 322 and a second line portion 323.

The ball bonding portion 321 is the portion formed by ball bonding using a capillary 7. The ball bonding portion 321 is bonded to a wire strip 4. The stitch bonding portion 322 is the portion formed by stitch bonding using a capillary 7. The stitch bonding portion 322 is bonded to the second semiconductor chip 12 (chip obverse surface 121). The second line portion 323 is the portion connecting the ball bonding portion 321 and the stitch bonding portion 322. The second line portion 323 extends from each of the ball bonding portion 321 and the stitch bonding portion 322. In the present embodiment, the second line portion 323 extends along a line. The second line portion 323 is circular in cross section perpendicular to the longitudinal direction and has a diameter of 40 to 100 μm. That is, the wire diameter of each second wire 32 is 40 to 100 μm. However, the wire diameter of each second wire 32 is not limited to this. In the present embodiment, the ball bonding portion 321 corresponds to an example of the "second bonding portion".

Each of the third wires 33 has one end bonded to a first semiconductor chip 11 (chip obverse surface 111) and the other end bonded to the second semiconductor chip 12 (chip obverse surface 121). Each of the third wires 33 is made with a capillary 7 described later. In the present embodiment, the semiconductor device A1 has three third wire 33. Each of the third wires 33 includes a ball bonding portion 331, a stitch bonding portion 332 and a third line portion 333.

The ball bonding portion 331 is the portion formed by ball bonding using a capillary 7. The ball bonding portion 331 is bonded to a first semiconductor chip 11 (chip obverse surface 111). The stitch bonding portion 332 is the portion formed by stitch bonding using a capillary 7. The stitch bonding portion 332 is bonded to the second semiconductor chip 12 (chip obverse surface 121). The third line portion 333 is the portion connecting the ball bonding portion 331 and the stitch bonding portion 332. The third line portion 333 extends from each of the ball bonding portion 331 and the stitch bonding portion 332. In the present embodiment, the third line portion 333 extends along a line. The third line portion 333 is circular in cross section perpendicular to the longitudinal direction and has a diameter of 40 to 100 μm. That is, the wire diameter of each third wire 33 is 40 to 100 μm. However, the wire diameter of each third wire 33 is not limited to this.

Each of the wire strips 4 is made of the same material as that for the first wires 31. That is, the wire strips 4 are mainly composed of the first metal. In the present embodiment, each wire strip 4 is made of an aluminum alloy to which one of iron, silicon and nickel is added. When each first wire 31 is made of pure aluminum, each wire strip 4 is also made of pure aluminum. Each wire strip 4 has an elongated shape and is rectangular as viewed in plan. Each wire strip 4 is bonded to a second wire bonding portion 222. To each of the wire strips 4A, a second wire 32 is bonded from the z1 direction side. Each wire strip 4 is made with a wedge tool 6 described later. Each wire strip 4 has substantially the same size as the wedge bonding portions 311 of the first wires 31.

The resin package 5 covers the semiconductor chips 1, some portions of the lead frame 2, the wires 3 and the wire strips 4. The resin package 5 is made of a thermosetting synthetic resin with electrically insulating properties. In the present embodiment, the resin package 5 is made of black epoxy resin. The resin package 5 is rectangular as viewed in plan.

A method for manufacturing the semiconductor device A1 according to an embodiment of the present disclosure is described below. The manufacturing method according to the present embodiment includes a first lead-frame-forming process, a die bonding process, a wire bonding process, a resin molding process and a second lead-frame-forming process. The semiconductor device A1 is manufactured through the above-described processes. In the present embodiment, the above-described processes are performed in the mentioned order.

Figure 5:
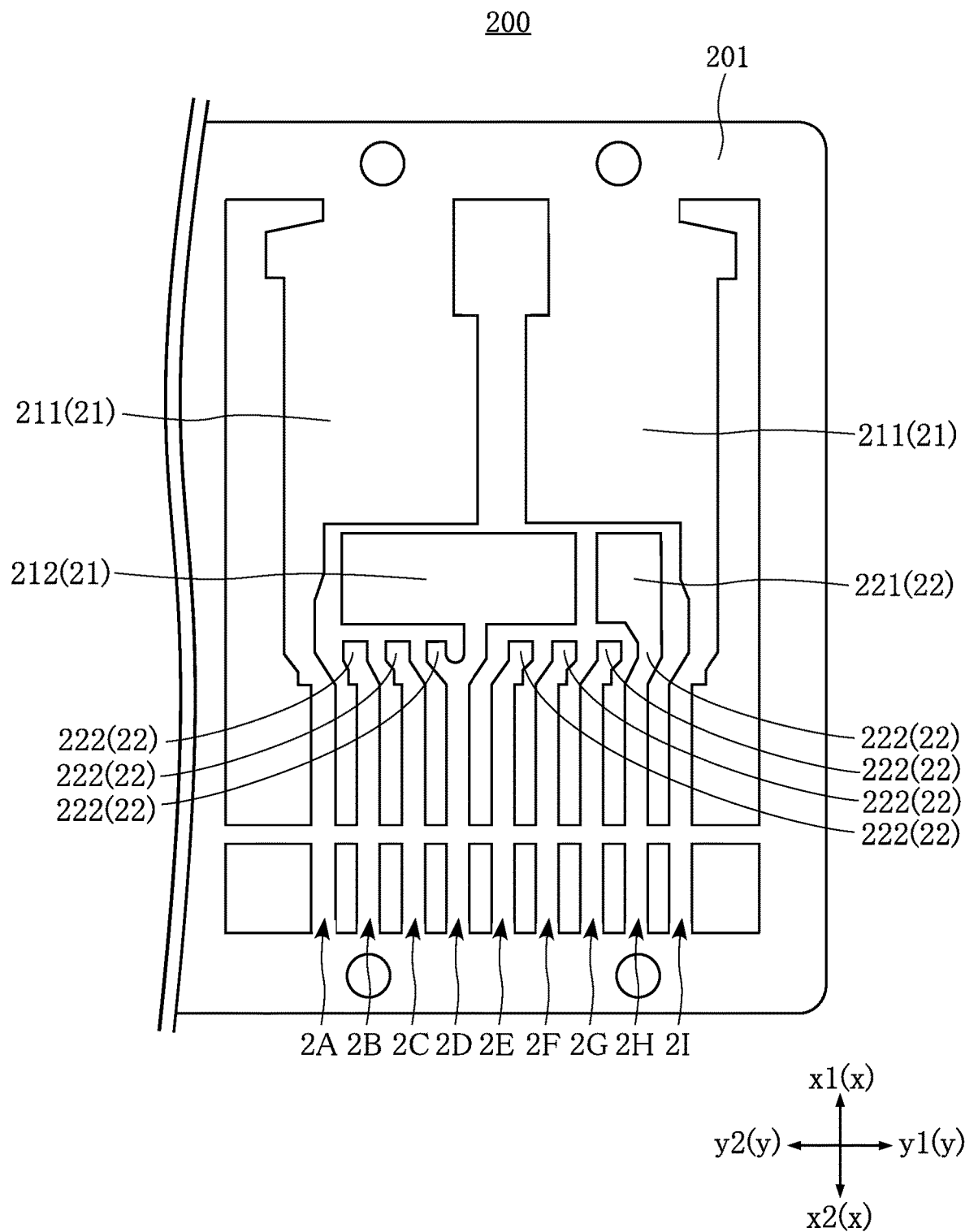
FIG. 5 shows a step of a manufacturing method according to an embodiment of the present disclosure.

In the first lead-frame-forming process, preparation is made for forming the lead frame 2 having the above-described structure. Specifically, in the first lead-frame-forming process, a copper plate is prepared and punched. The punching may be performed by a known method. In this way, the lead frame 200 shown in FIG. 5 is obtained. The lead frame 200 includes a frame 201 and a plurality of leads (first to ninth leads 2A-2I) supported by the frame 201. The first to the ninth leads 2A-2I include portions corresponding to the above-described die bonding portions 21, wire bonding portions 22, terminal portions 23 and heat dissipating portions 24. At this stage, the lead frame 200 has a plate-like shape and is not bent.

Then, a bending process is performed to the lead frame 200. In the bending process, the lead frame 200 is bent in such a manner that the first die bonding portions 211 are translated in the z2 direction. As a result, the first die bonding portions 211 are positioned in the z2 direction relative to the second die bonding portion 212. Note that, in the first lead-frame-forming process, punching and bending may be performed simultaneously.

Thereafter, plating is performed. In the present embodiment, Ni-plating is applied to the entirety of the lead frame 200. Note that plating may be applied only to the first wire bonding portions 221 and the second wire bonding portions 222.

Figure 6:
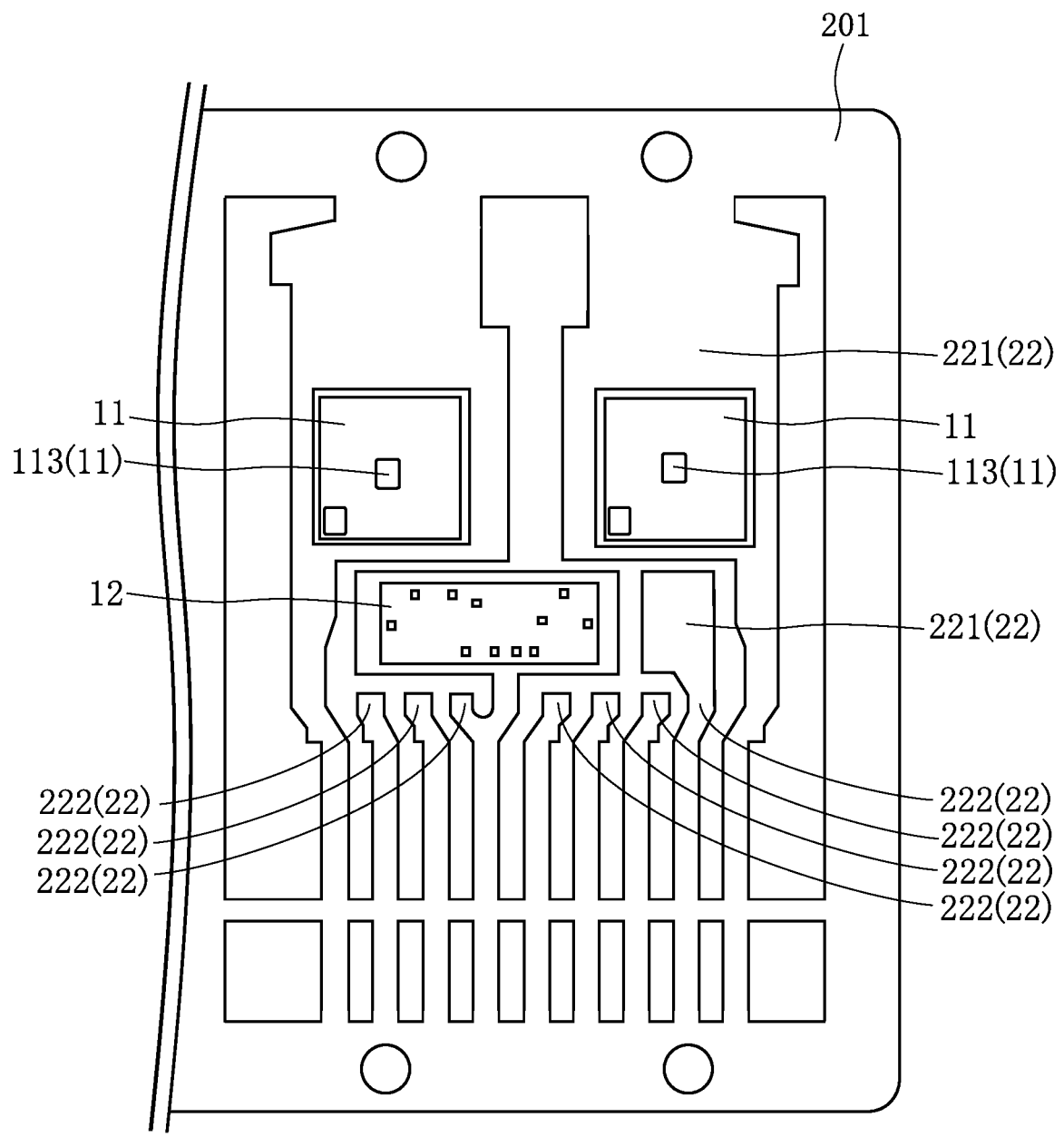
FIG. 6 shows a step of a manufacturing method according to an embodiment of the present disclosure.

Subsequently, in the die bonding process, the semiconductor chips 1 are die-bonded to the die bonding portions 21 of the lead frame 200. In the present embodiment, each of the first semiconductor chips 11 is placed on one of the first die bonding portions 211 via a bonding layer 91. In this way, the first semiconductor chip 11 is bonded to the first die bonding portion 211. Further, the second semiconductor chip 12 is placed on the second die bonding portion 212 via a bonding layer (not shown). In this way, the second semiconductor chip 12 is bonded to the second die bonding portion 212. The die bonding process may be performed by any method that allows the semiconductor chips 1 to be bonded at predetermined positions. By the die bonding process, the lead frame 200 shown in FIG. 6 is obtained.

Subsequently, in the wire bonding process, the wires 3 and the wire strips 4 are bonded to the lead frame 200 and the semiconductor chips 1 bonded to the lead frame 200. In the present embodiment, the wire bonding process includes a wire strip forming step, a first wire forming step, a second wire forming step and a third wire forming step, which are performed in the mentioned order. Note that the wire strip forming step and the first wire forming step may be performed in reverse order. Note also that the second wire forming step and the third wire forming step may be performed in reverse order.

Figure 7A:
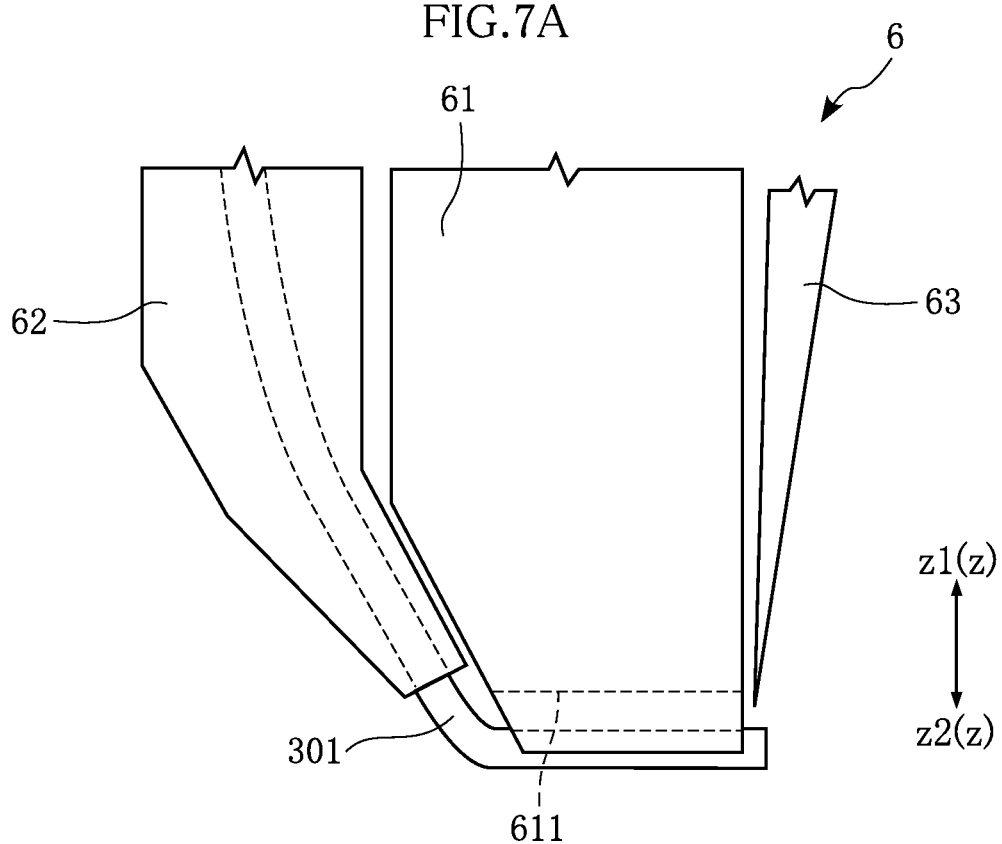
FIGS. 7A-7C show an example of a wedge tool for use in an embodiment of the present disclosure.
Figure 7B:
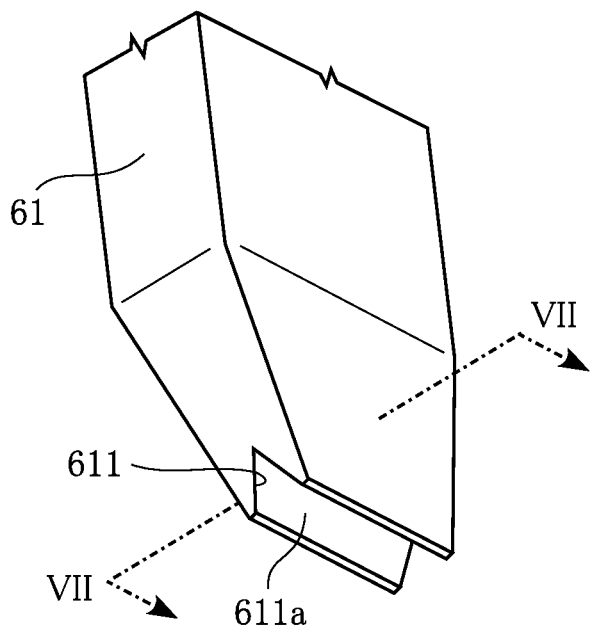
Figure 7C:
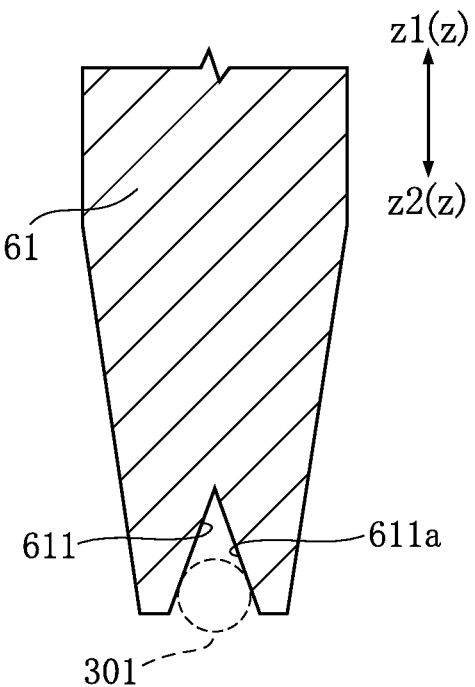

First, in the wire strip forming step, a plurality of wire strips 4 are formed of a first wiring material 301 by using a wedge bonding apparatus. The first wiring material 301 is mainly composed of a metal having an electrical conductivity. In the present embodiment, the first wiring material 301 is made of an aluminum-based alloy, which is mainly composed of aluminum, to which one of iron, silicon and nickel is added. The wire diameter of the first wiring material 301 is about 300 to 400 μm. FIGS. 7A-7C show an example of a wedge tool 6 of a wedge bonding apparatus used in the present embodiment. The wedge tool 6 has a wedge 61, a wire guide 62 and a cutter 63. In addition to these, a horn that supports these members and applies ultrasonic vibration, a main body that supports the horn, and a wire reel for winding the first wiring material 301 and so on are also provided by the tool 6, illustration and description of which are omitted. FIG. 7A is a front view showing the entirety of the wedge tool 6. FIG. 7B is a perspective view of the wedge 61. FIG. 7C is a sectional view taken along line VII-VII in FIG. 7B.

The wedge 61 is used to press the first wiring material 301 and bond the first wiring material 301 to a bonding object by ultrasonic vibration. For example, the wedge 61 is made of tungsten carbide. As shown in FIGS. 7A-7C, the wedge 61 is formed with a guide groove 611. The guide groove 611 is provided at the lower end of the wedge 61. In the present embodiment, the guide groove 611 is V-shaped in cross section, as shown in FIG. 7C. The wire guide 62 is fixed to the wedge 61 and guides the first wiring material 301 wound around the wire reel to the wedge 61. The cutter 63 is used for cutting the first wiring material 301. The cutter 63 is arranged adjacent to the wedge 61. The wire guide 62 and the cutter 63 are arranged on the opposite sides of the wedge 61.

Figure 8A:
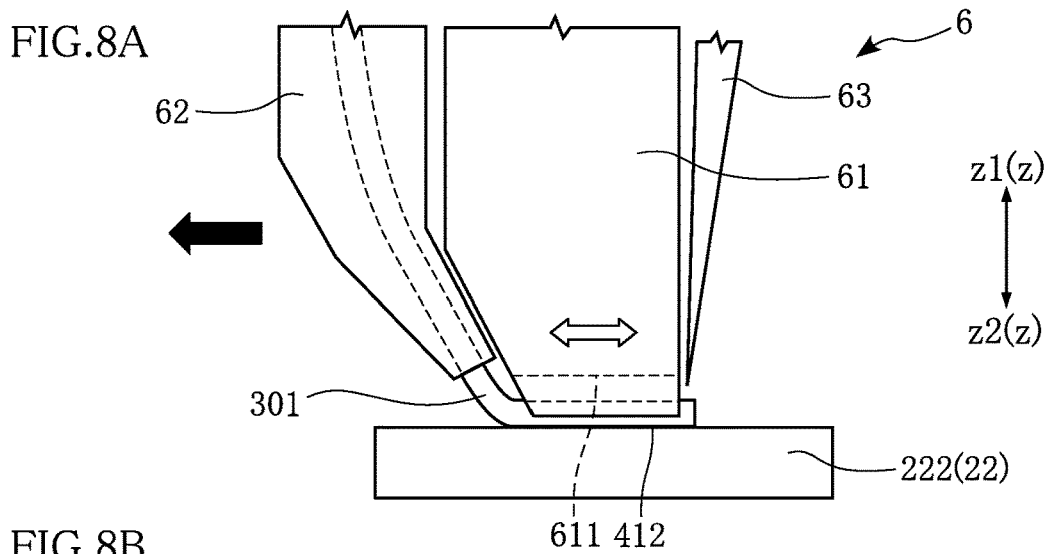
FIGS. 8A-8C show how a wire strip is formed.
Figure 8B:
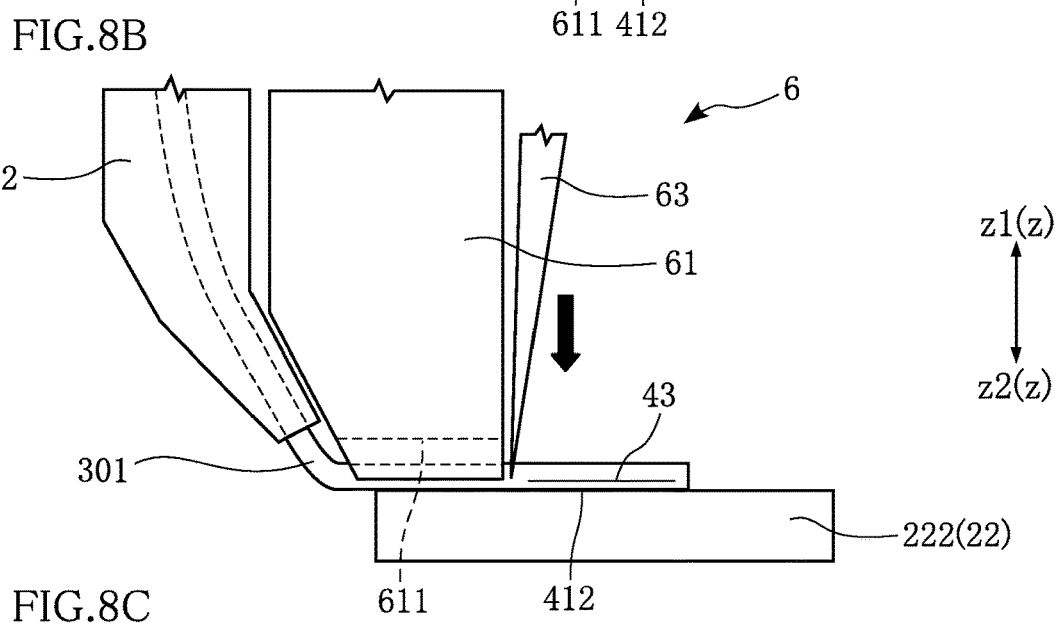
Figure 8C:
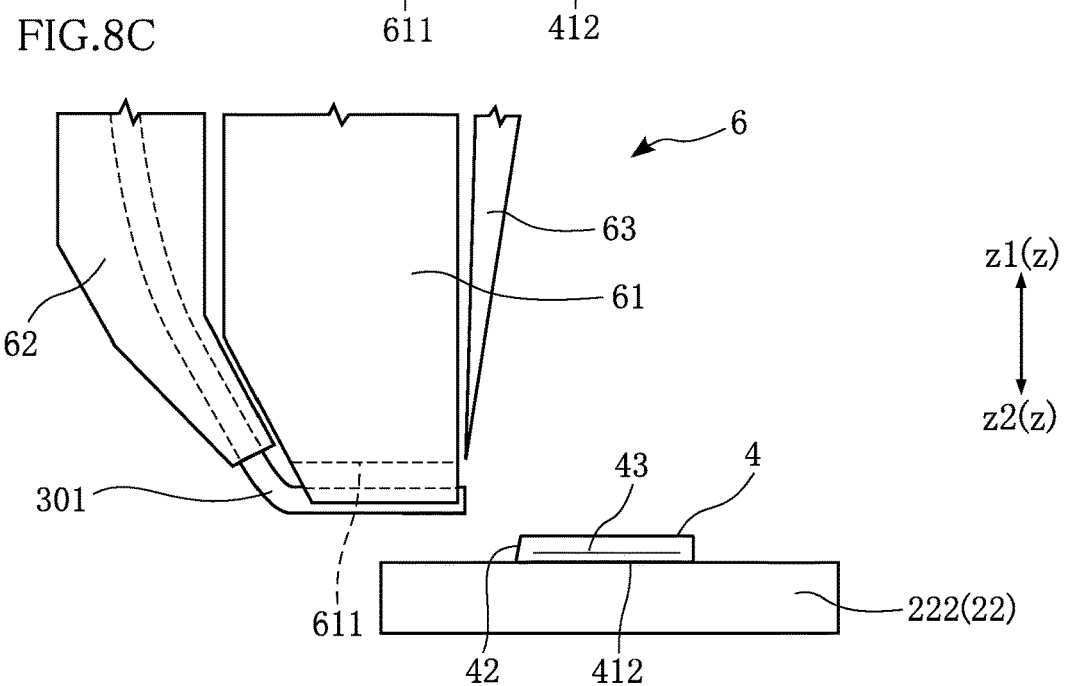
Figure 9A:
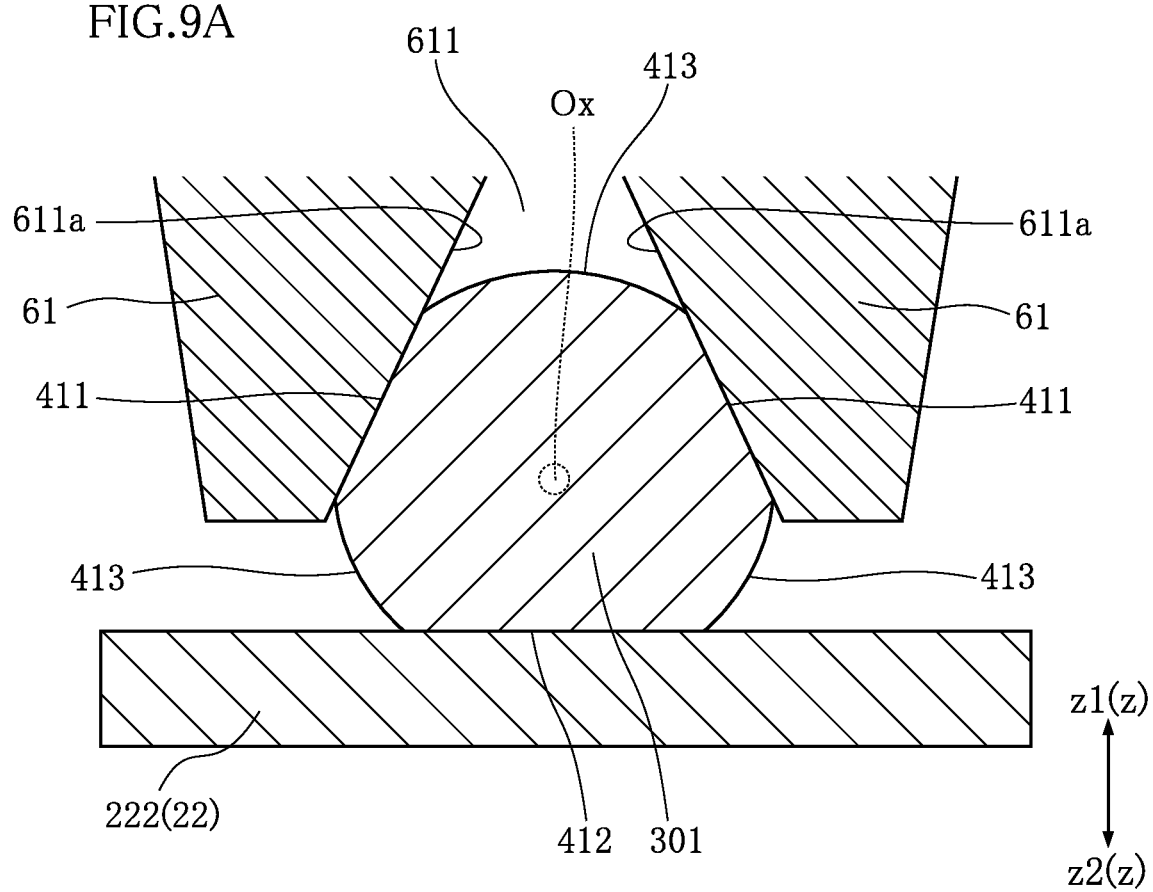
FIGS. 9A and 9B are sectional views showing a first wiring material and a wire strip in the wire strip forming step shown in FIGS. 8A-8C.
Figure 9B:
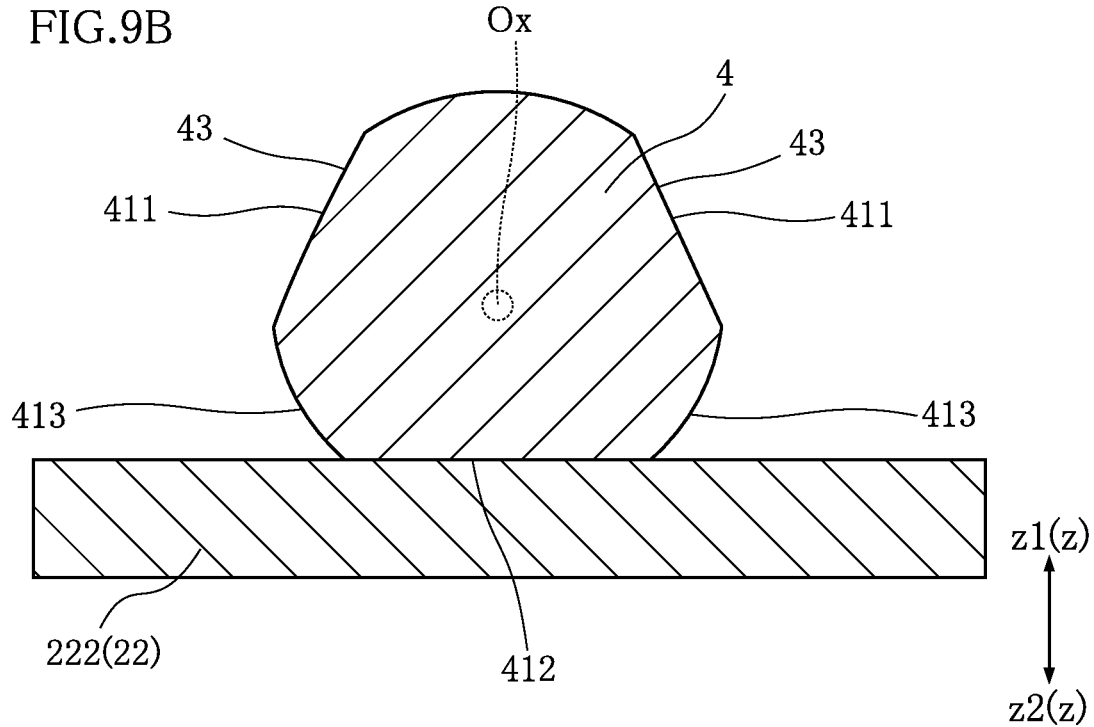

FIGS. 8A-8C and FIGS. 9A-9B show how a wire strip 4 is formed by using the wedge tool 6 having the above-described structure. FIGS. 8A-8C are front views of the wedge tool 6. FIGS. 9A-9B are sectional views as viewed in the direction in which the first wiring material 301 extends (i.e., longitudinal direction of the wire strip 4) at the tip end of the wedge 61. Specifically, FIG. 9A is a sectional view showing the first wiring material 301 at the stage shown in FIG. 8A. FIG. 9B is a sectional view showing the wire strip 4 at the stage shown in FIG. 8C.

First, as shown in FIG. 7A, the tip end of the wedge 61 of the wedge tool 6, which is in a state ready for wedge bonding, is placed directly above a second wire bonding portion 222. Then, the tip end of the wedge 61 is moved toward the second wire bonding portion 222. At this stage, an end of the first wiring material 301 is fitted in the guide groove 611.

Then, as shown in FIG. 8A, wedge bonding using the wedge tool 6 is performed. Specifically, with the wedge 61 pressed against the second wire bonding portion 222, ultrasonic vibration is applied. In this process, the first wiring material 301 is pressed against the second wire bonding portion 222, forming a contact surface 412 as shown in FIG. 9A. The contact surface 412 is a surface offset from the outer circumferential surface 413, which is arcuate in cross section, toward the central axis Ox of the first wiring material 301. In the present embodiment, since the surface of the second wire bonding portion 222 is flat, the contact surface 412 also becomes flat. In pressing the first wiring material 301 against the second wire bonding portion 222, two pressed surfaces 411 are also formed. Each of the pressed surfaces 411 is a portion pressed against an inner surface 611a of the guide groove 611. Each pressed surface 411 is a surface offset from the outer circumferential surface 413, which is arcuate in cross section, toward the central axis Ox of the first wiring material 301. Each pressed surface 411 appears as a press trace 43 by the wedge tool 6. The end of the first wiring material 301 is further crushed by ultrasonic vibration. In this way, the end of the first wiring material 301 and the second wire bonding portion 222 are bonded by ultrasonic welding.

Then, the wedge tool 6 is moved to the left in the figure (see the black arrow in FIG. 8A). As a result, as shown in FIG. 8B, the cutter 63 is positioned between the left end of the contact surface 412 in the figure and the left end of the second wire bonding portion 222 in the figure. Then, as shown in FIG. 8B, the cutter 63 is lowered (see the black arrow in FIG. 8B) to form a cut line in the first wiring material 301. The lowering amount of the cutter 63 is set in such a manner that the cutter 63 does not completely cut the first wiring material 301. Then, as shown in FIG. 8C, the first wiring material 301 along with the wedge 61 is moved away from the second wire bonding portion 222. As a result, the first wiring material 301, which has been formed with the cutting line, is cut completely, so that the wire strip 4 is provided. As shown in FIG. 9B, the wire strip 4 formed in this way has a (mountain-like) cross section including the pressed surfaces 411, the contact surface 412 and the outer circumferential surface 413. Further, the portion of the wire strip 4 that is most offset in the z1 direction in cross section extends continuously in the longitudinal direction. That is, the wire strip 4 has a ridge that continues in the longitudinal direction. In the wire strip 4, the pressed surfaces 411 appear as the press traces 43 (wedge press trace). Further, the wire strip 4 has a cut surface 42 at one end in the longitudinal direction, which is formed as a result of cutting the first wiring material 301. In this way, the wire strip forming step is completed. Note that since the wire strip 4 is formed of the first wiring material 301, the wire diameter (cross sectional dimension) of the wire strip 4 is substantially the same as the wire diameter (300 to 400 μm) of the first wiring material 301 though crushed to some degree by the wedge 61.

Subsequently, in the first wire forming step, a plurality of first wires 31 are formed by using the above-described wedge bonding apparatus. That is, the same wedge tool 6 as that used for the wire strip forming step is used for the first wire forming step.

In the first wire forming step, similarly to the wedge bonding in the wire strip forming step (see FIG. 8A), the first wiring material 301 is first wedge-bonded to the first semiconductor chip 11 (electrode pad 113) by using the wedge tool 6. Specifically, with the wedge 61 that holds the first wiring material 301 in the guide groove 611 pressed against the first semiconductor chip 11 (electrode pad 113), ultrasonic vibration is applied. As a result, the end of the first wiring material 301 and the electrode pad 113 are bonded by ultrasonic welding. The welded portion is the wedge bonding portion 311 of the first wire 31.

Then, without cutting the first wiring material 301 unlike the wire strip forming step, the wedge tool 6 is moved while allowing the first wiring material 301 to be drawn out from the wedge tool (looping). By this process, the first line portion 313 of the first wire 31 is formed. In this looping, the wedge 61 is placed directly above a first wire bonding portion 221.

Then, the first wiring material 301 is wedge-bonded to a first wire bonding portion 221 by using the wedge tool 6. Specifically, the tip end of the wedge 61 is moved toward the first wire bonding portion 221. Then, with the wedge 61 pressed against the first wire bonding portion 221, ultrasonic vibration is applied. In this way, the first wiring material 301 and the first wire bonding portion 221 are bonded by ultrasonic welding. The welded portion is the wedge bonding portion 312 of the first wire 31. The shape of the wedge bonding portion 312 is substantially the same as the shape of the wedge bonding portion 311. Thereafter, similarly to the wire strip forming step, the first wiring material 301 is cut as shown in FIGS. 8B and 8C, whereby the first wire 31 is formed.

The first wire forming step is completed in this way. In the first wire forming step, the first wiring material 301 may first be wedge-bonded to the first wire bonding portion 221 and then wedge-bonded to the electrode 113 after looping.

The lead frame 200 as shown in FIG. 10 is obtained by conducting the wire strip forming step a plurality of times (the number of times corresponding to the number of required wire strips 4) and conducting the first wire forming step a plurality of times (the number of times corresponding to the number of required first wires 31).

Figure 11:
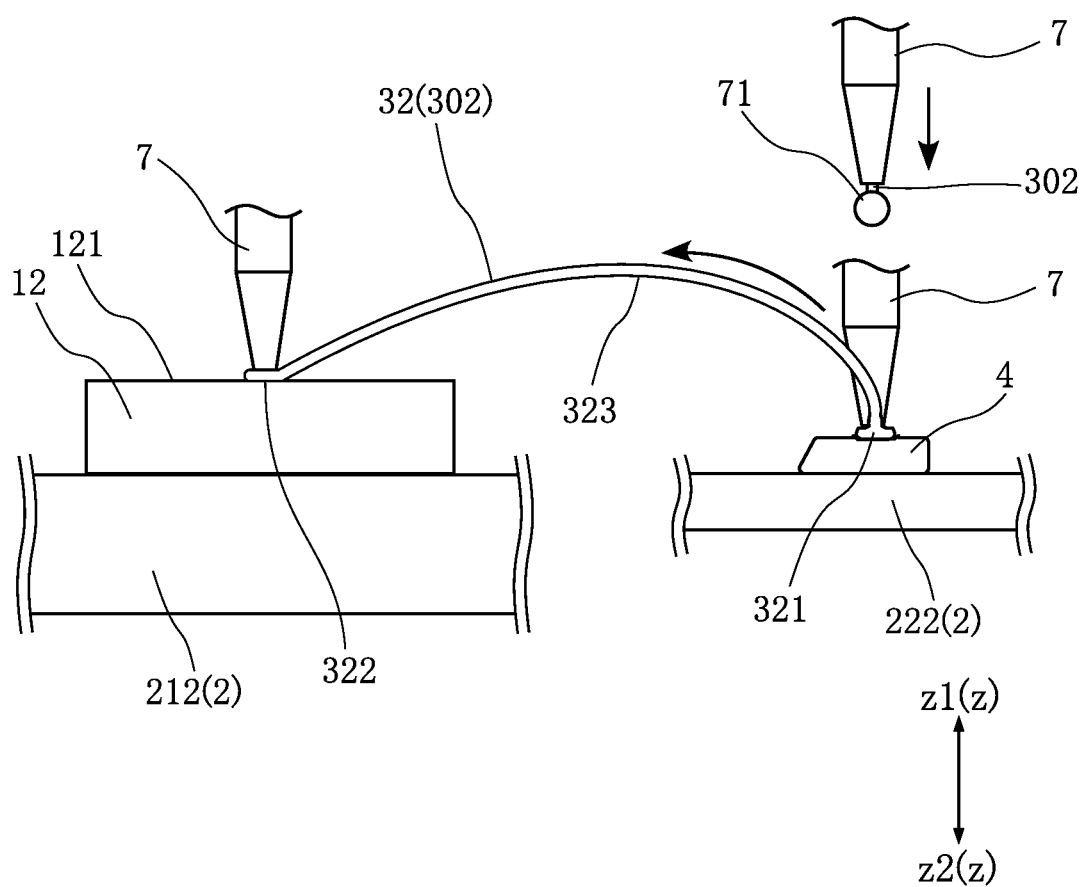
FIG. 11 shows how a second wire is formed in a second wire forming step according to an embodiment of the present disclosure.

Subsequently, in the second wire forming step, a plurality of second wires 32 are formed of a second wiring material 302 by using a ball bonding apparatus. The second wiring material 302 is mainly composed of a metal having an electrical conductivity, which is different from the metal forming the first wiring material 301. In the present embodiment, the second wiring material 302 is mainly composed of gold. The wire diameter of the second wiring material 302 is about 40 to 100 µm. The ball bonding apparatus has a capillary 7. FIG. 11 shows how a second wire 32 is formed using a capillary 7.

First, by using the capillary 7, the second wiring material 302 is ball-bonded to a wire strip 4. Specifically, an end of the second wiring material 302 is caused to project from the tip end of the capillary 7, and the projecting end of the second wiring material 302 is melted. Thus, a molten ball 71 is formed. Then, the molten ball 71 is pressed against the wire strip 4. Then, with the molten ball 71 pressed against the wire strip 4, ultrasonic vibration is applied, so that the ball-shaped second wiring material 302 is bonded to the wire strip 4. In this way, the ball bonding portion 321 of the second wire 32 is formed. In applying the ultrasonic vibration in this ball bonding process, vibration in the longitudinal direction of the wire strip 4 may be applied. As shown in FIG. 4, by such ultrasonic vibration, the wire strip 4 includes two portions that each are bonded to the second wire 32 (the ball bonding portion 321), that are spaced apart from each other in the direction of vibration, and that each project in the z1 direction.

Then, the capillary 7 is moved while allowing the second wiring material 302 to be drawn from the capillary 7 (looping). By this process, the second line portion 323 of the second wire 32 is formed. In this looping, the capillary 7 is placed directly above a bond position in the chip obverse surface 121 of the second semiconductor chip 12. In the present embodiment, the capillary 7 is moved linearly from the wire strip 4 to the semiconductor chip 12.

Then, by using the capillary 7, the second wiring material 302 is stitch-bonded to the second semiconductor chip 12. Specifically, the capillary 7 is moved toward the chip obverse surface 121. Then, with the second wiring material 302 pressed against the chip obverse surface 121, ultrasonic vibration is applied. As a result, the second wiring material 302 is bonded to the chip obverse surface 121, so that the stitch bonding portion 322 of the second wire 32 is formed. Then, the capillary 7 holding the second wiring material 302 is lifted. As a result, the second wiring material 302 is cut, whereby the second wire 32 is formed. In stitch bonding the second wiring material 302 (second wire 32) to the second semiconductor chip 12, the pressing force or ultrasonic vibration applied during the stitch bonding may damage the second semiconductor chip 12. To avoid such damage, a bump may be formed on the second semiconductor chip 12 by using the second wiring material 302 before the second wire 32 is bonded.

Subsequently, in the third wire forming step, a plurality of third wires 33 are formed of the second wiring material 302 by using the ball bonding apparatus, similarly to the second wire forming step. That is, the third wires 33 are also formed using the capillary 7. To form a third wire 33, the second wiring material 302 is ball-bonded to a first semiconductor chip 11 (chip obverse surface 111). Thus, a ball bonding portion 331 is formed. Then, the third line portion 333 is formed by looping. In the present embodiment, the capillary 7 is moved linearly from the first semiconductor chip 11 to the second semiconductor chip 12. Then, the second wiring material 302 is stitch-bonded to the second semiconductor chip 12 (chip obverse surface 121). By this process, the stitch bonding portion 332 is formed. Then, the capillary 7 holding the second wiring material 302 is lifted. As a result, the second wiring material 302 is cut, whereby the third wire 33 is formed.

Figure 12:
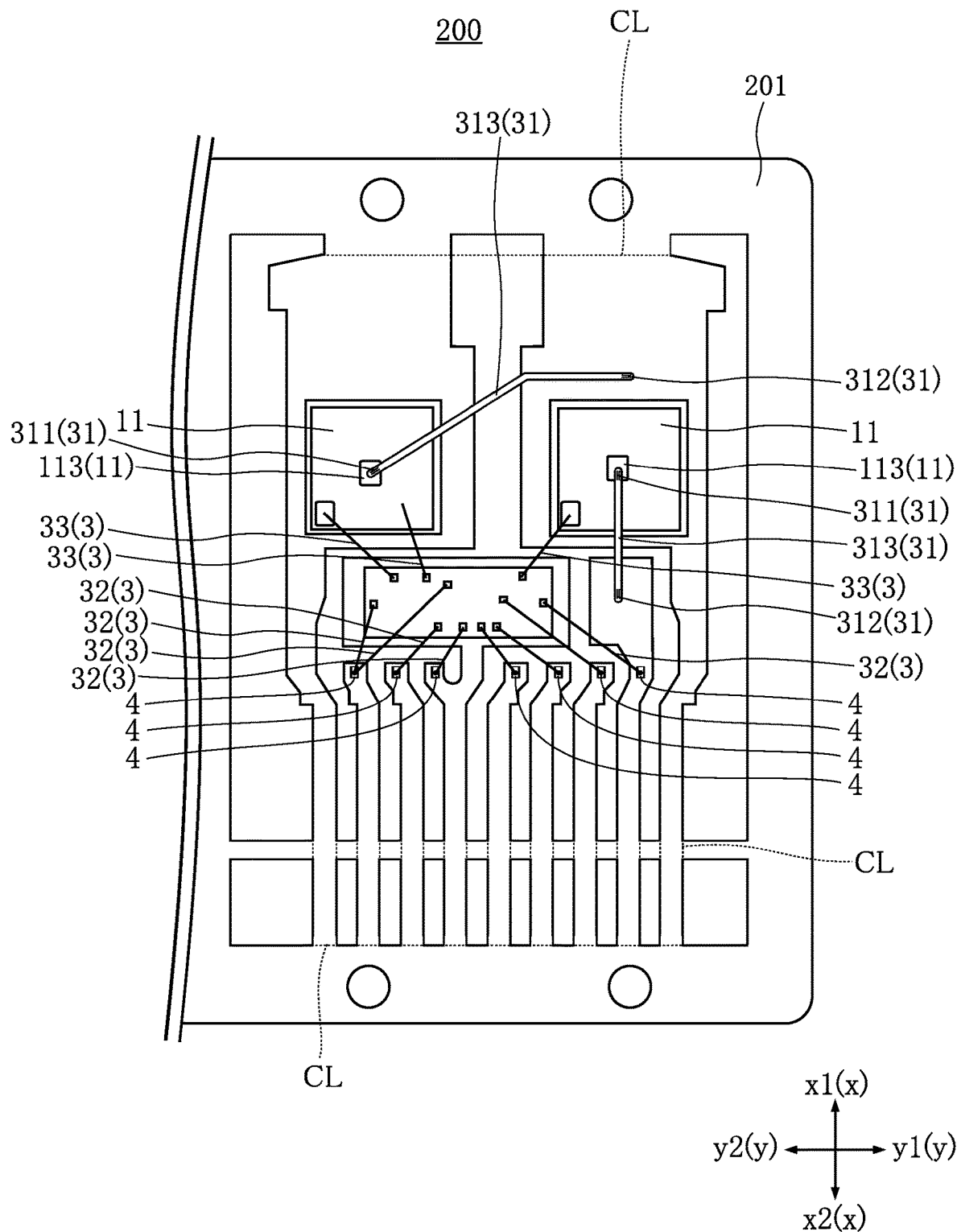
FIG. 12 shows a step of a manufacturing method according to an embodiment of the present disclosure.

In this way, the second wire forming step and the third wire forming step are completed. The lead frame 200 as shown in FIG. 12 is obtained by conducting the second wire forming step a plurality of times (the number of times corresponding to the number of required second wires 32) and conducting the third wire forming step a plurality of times (the number of times corresponding to the number of required third wires 33). That is, FIG. 12 shows the lead frame 200 after the completion of the wire bonding process.

Figure 14:
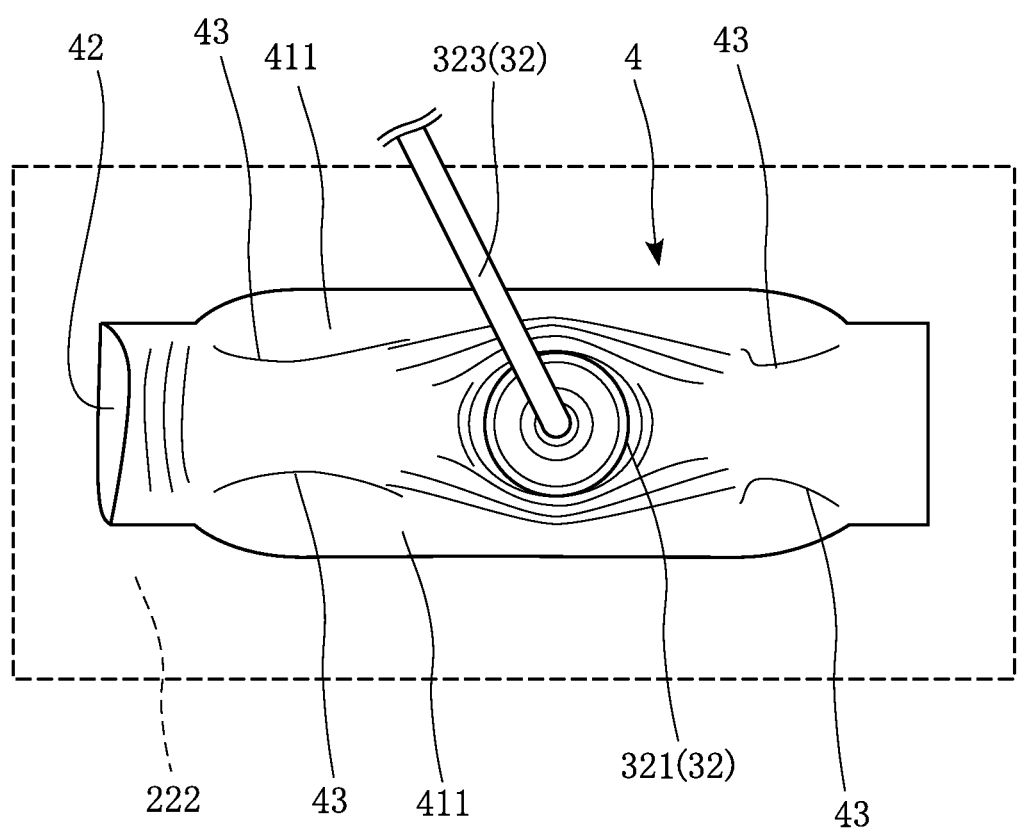
FIG. 14 is a plan view showing a wire bonding structure according to an embodiment of the present disclosure.

Through the wire strip forming step and the second wire forming step, the wire bonding structures as shown in FIGS. 13A-13C and FIG. 14 are formed, each of which is made up of a second wire bonding portion 222, a wire strip 4 and a second wire 32. FIGS. 13A-13C are sectional views in a plane perpendicular to the longitudinal direction of the wire strip 4. FIG. 14 is a view (plan view) of a wire strip 4 after the second wire forming step, as viewed in the z1 direction. Note that FIG. 14 shows the wire strip 4 having the cross section shown in FIG. 13A.

The wire bonding structures may have one of the cross sectional shapes shown in FIGS. 13A-13C depending on various conditions such as a pressing force or an environmental temperature in ball bonding the second wire 32, relative hardness of the second wire 32 and the wire strip 4, etc. For convenience of understanding, in FIGS. 13A-13C, the wire strip 4 before the second wire 32 is bonded (see FIG. 9B) is indicated by a dotted line.

FIGS. 13A and 14 show the wire bonding structure in the case where the wire strip 4 is crushed by the second wire 32. In this case, as compared with the wire strip 4 before the second wire 32 is formed, the upper surface of the wire strip 4 is dented as shown in FIG. 13A. Each side of the dented portion projects in such a manner as to cover a part of the second wire 32 (ball bonding portion 321). Because of the wire strip 4, the lower surface of the ball bonding portion 321 has a less amount of curving (curvature) as compared with the state of the molten ball 71. As shown in FIG. 14, the pressed surfaces 411 of the wire strip 4 are partially deformed due to the pressing by the ball bonding portion 321. Note that FIG. 4 shows the wire bonding structure in the case of FIG. 13A. FIG. 13B shows the wire bonding structure in the case where the second wire 32 and the wire strip 4 have crushed each other. In this case, as shown in FIG. 13B, the lower surface of the second wire 32 (ball bonding portion 321) and the upper surface of the wire strip 4 are crushed to substantially the same extent, so that both of the lower surface of the ball bonding portion 321 and the upper surface of the wire strip 4 are flattened. FIG. 13C shows the wire bonding structure in the case where the wire strip 4 has not been deformed. In this case, as shown in FIG. 13C, the lower surface of the second wire 32 (ball bonding portion 321) is curved along the shape of the upper surface of the wire strip 4. In each of FIGS. 13A-13C, the second wire 32 is formed on the wire strip 4 and spaced apart from the second wire bonding portion 222. The wire bonding structures are not limited to those shown in FIGS. 13A-13C and may have any shape that is similar to those shown in FIGS. 13A-13C.

In the resin molding process, the resin package 5 is formed. In the present embodiment, the resin package is formed by molding. In the resin molding process, the lead frame 200 after the die bonding process (see FIG. 12) is pressed with a mold (not shown), and a resin material is injected into the cavity of the mold. The resin material is then hardened, whereby the resin package 5 is formed.

In the second lead-frame-forming process, the process for making the lead frame 200 after the resin molding process into the lead frame of the semiconductor device A1 shown in FIGS. 1-3 is performed. Specifically, in the second lead-frame-forming process, a cutting (cutting-out) process and a bending process are performed. In the cutting process, cutting is performed along the cutting lines CL (dotted lines) shown in FIG. 12 and so on, to remove the portions connecting the first to ninth leads 2A-2I and the frame 201. In the bending process, bending is performed in such a manner that the ends of the first to ninth leads 2A-2I in the x2 direction are translated in the z2 direction relative to the portions (terminal portions 23) projecting from the resin package 5. In this way, the terminal portions 23 are formed into a bent shape.

By conducting the above-described processes in order, the semiconductor device A1 shown in FIGS. 1-4 is manufactured.

The lead frame 2 in the present embodiment is entirely plated with Ni. Thus, directly bonding the second wires 32, which are mainly composed of gold, to the second wire bonding portions 222, which are Ni-plated, may provide a poor bonding strength. According to the present embodiment, the second wires 32 (ball bonding portions 321) are bonded to the second wire bonding portions 222 via the wire strips 4. The wire strips 4 are mainly composed of aluminum, similarly to the first wires 31. Thus, the bonding strength between the second wires 32 and the wire strips 4 is greater than the bonding strength in the case where the second wires 32 are directly bonded to the second wire bonding portions 222. Thus, although the first wires 31 and the second wires 32 that are made of different kinds of metal are bonded to the lead frame 2, which is entirely plated with a single kind of material or Ni, bonding strength variations between the first wires 31 (wedge bonding portions 312) and the second wires 32 (ball bonding portions 321) are prevented. Since it is not necessary to apply multiple types of plating to the lead frame 2, the manufacturing efficiency of the semiconductor device A1 does not decrease.

According to the present embodiment, both of the wire strips 4 and the first wires 31 are wedge-bonded to the lead frame 2. Further, the wire strips 4 and the first wires 31 are formed of the same first wiring material 301. This allows the same wedge bonding apparatus (wedge tool 6) to be used for the wire strip forming step and the first wire forming step. Thus, the complexity of the manufacturing process that may be caused by using a different bonding apparatus or changing the wiring material for wire bonding can be avoided.

According to the present embodiment, the cross-sectional dimension of the wire strips 4 is about 300 to 400 μm, whereas the diameter of the second wires 32 is 40 to 100 μm. That is, the cross-sectional dimension of the wire strips 4 is larger than the diameter of the second wires 32. This allows the second wire 32 to be reliably ball-bonded to the wire strip 4. That is, the ball bonding portions 321 of the second wires 32 are reliably formed on the wire strips 4.

Variations of the semiconductor device A1 and its manufacturing method according to the present embodiment are described below.

In the foregoing embodiment, description is made as to the case where the first metal (the first wires 31 and the wire strips 4) is mainly composed of aluminum and the second metal (the second wires 32) is mainly composed of gold. However, the first metal and the second metal are not limited to these and may be chosen appropriately in view of the compatibility for the metal bonding with the (outermost layer of) lead frame 2 as the bonding target. Specifically, the combination of the first metal and the second metal may be selected to satisfy the following conditions: the bonding strength between the first metal and the lead frame 2 is greater than the bonding strength in the case where the second metal and the lead frame 2 are directly bonded, and the bonding strength between the first metal and the second metal is greater than the bonding strength in the case where the second metal and the lead frame 2 are directly bonded. For example, in the foregoing embodiment, instead of a metal mainly composed of gold, a metal mainly composed of copper may be used for the second wires 32. Further, in the foregoing embodiment, the lead frame 2 may not be plated with Ni, and the outermost layer of the lead frame 2 may be copper. When the lead frame 2 is not entirely plated with Ni, plating may be applied to the portions of the lead frame 2 that are not covered with the resin package 5 to prevent deterioration due to natural oxidation, etc. Even in such a case, the above-described advantages can be achieved.

In the foregoing embodiment, in the second wire forming step, the second wiring material 302 (second wire 32) is ball-bonded to each wire strip 4 and stitch-bonded to the second semiconductor chip 12 (chip obverse surface 121) to form the second wires 32. Unlike this, the second wiring material 302 (second wire 32) may be ball-bonded to the second semiconductor chip 12 (chip obverse surface 121) and stitch-bonded to each wire strip 4 to form the second wires 32. In this case, the ball bonding portion 321 of the second wire 32 is formed on the second semiconductor chip 12, and the stitch bonding portion 322 of the second wire 32 is formed on the wire strip 4. Thus, in this variation, the stitch bonding portion 322 corresponds to an example of a "second bonding portion".

In stitch-bonding the second wires 32 to the wire strips 4, the following points may be considered. In the foregoing embodiment, the second wire 32 is ball-bonded to the wire strip 4, so that the ball bonding portion 321 of the second wire 32 is formed on the wire strip 4. Since the ball bonding portion 321 is shaped like a ball (i.e., spherical), with respect to the direction of the ultrasonic vibration applied during the ball bonding, the direction of movement of the capillary 7 during the following looping is not particularly limited. That is, the second line portion 323 can be formed to extend in any direction relative to the ball bonding portion 321. However, in stitch-bonding the second wire 32 to the wire strip 4, the direction of ultrasonic vibration applied during stitch-bonding may need to correspond to the direction in which the capillary 7 has moved during the looping. That is, the direction of ultrasonic vibration during stitch-bonding may need to be identical with the direction in which the second line portion 323 extends from the stitch bonding portion 322. For this purpose, the second wire 32 may be formed in such a manner that the second line portion 323 extends from the stitch bonding portion 322 along the longitudinal direction of the wire strip 4. This allows the direction in which the ridge of the wire strip 4 extends and the direction of ultrasonic vibration applied during stitch bonding to correspond to each other. This assures that the pressing force is efficiently transmitted to the second wire 32 during the stitch bonding. Thus, in switch-bonding the second wire 32 to the wire strip 4, the bonding strength between the second wire 32 and the wire strip 4 is enhanced. When the direction in which the second line portion 323 extends in forming the second wire 32 is determined in advance, the wire strip 4 may be formed in such a manner that its longitudinal direction identical with that direction.

Figure 15:
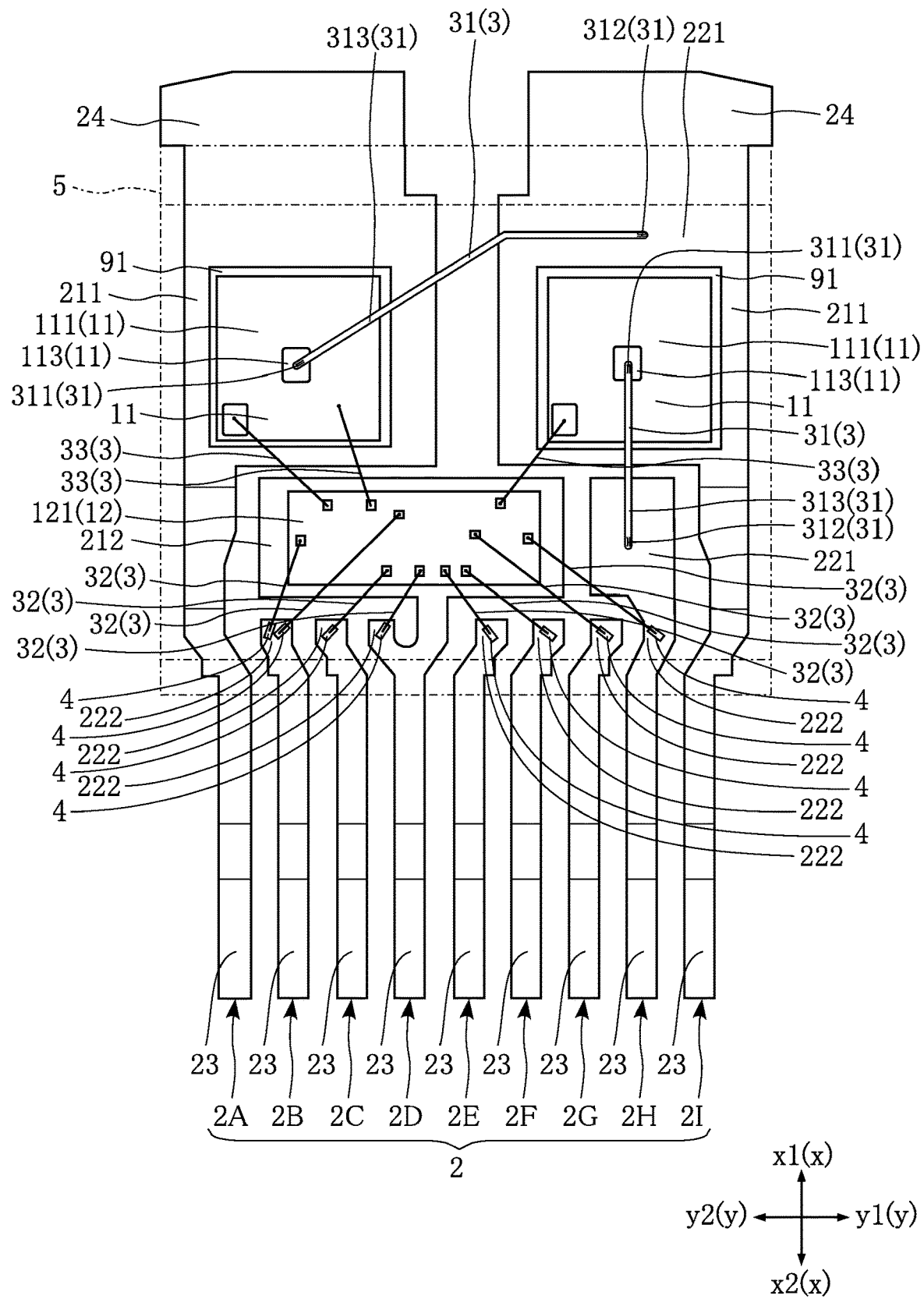
FIG. 15 is a plan view showing a semiconductor device according to a variation of the present disclosure.
Figure 16A:
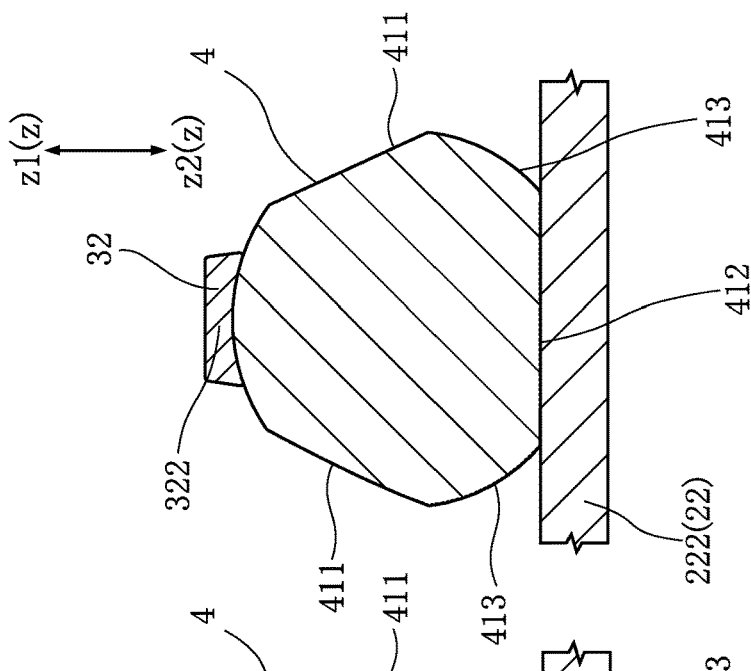
FIGS. 16A-16C are sectional views showing a wire bonding structure according to a variation of the present disclosure.
Figure 16B:
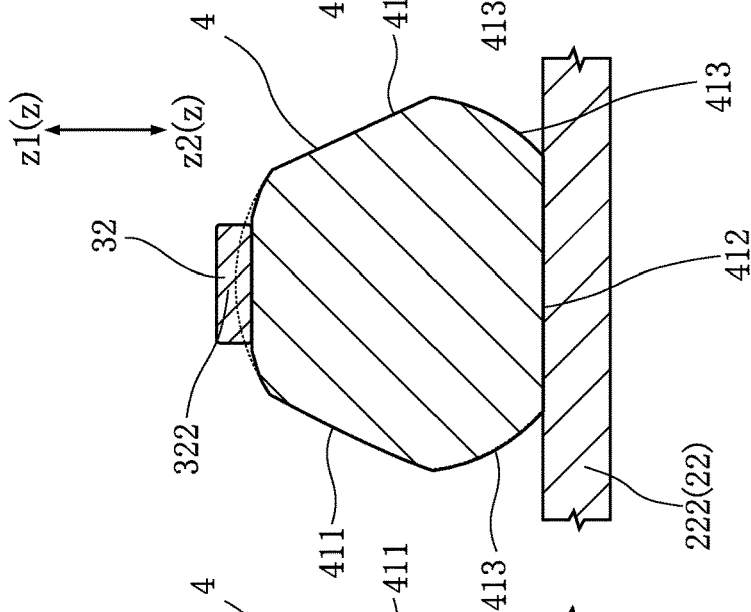
Figure 16C:
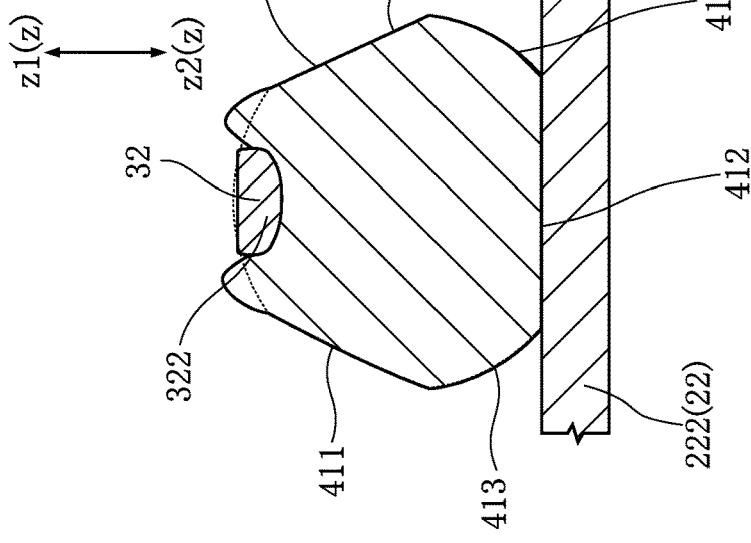
Figure 17:
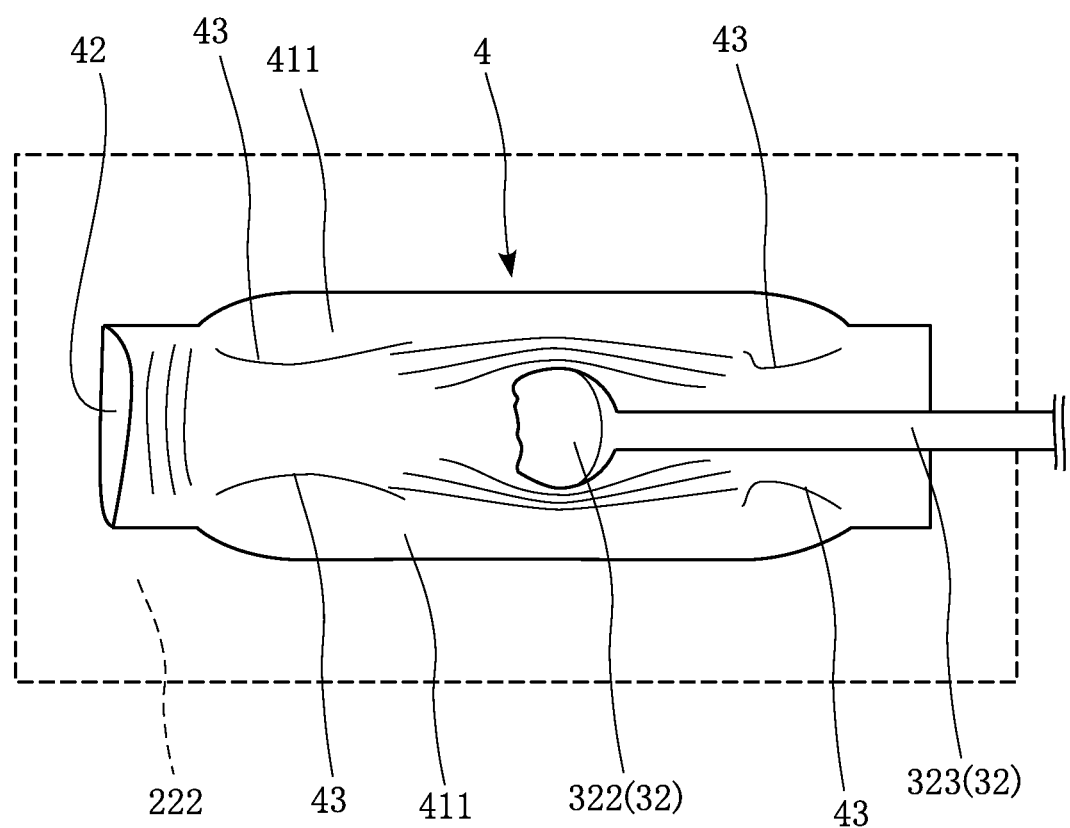
FIG. 17 is a plan view showing a wire bonding structure of a semiconductor device according to a variation of the present disclosure.

FIG. 15 shows a semiconductor device A1' in which the second wires 32 are stitch-bonded to the wire strips 4. FIG. 15 is a plan view of the semiconductor device A1'. FIGS. 16A-16C and FIG. 17 show wire bonding structures in the semiconductor device A1'. FIGS. 16A-16C are sectional views of the wire bonding structure in a plane perpendicular to the longitudinal direction of the wire strip 4. The conditions of the wire bonding structures shown in FIGS. 16A-16C correspond to those shown in FIGS. 13A-13C, respectively. That is, FIG. 16A shows the wire bonding structure in the case where the wire strip 4 is crushed by the second wire 32. FIG. 16B shows the wire bonding structure in the case where the second wire 32 and the wire strip 4 have crushed each other. FIG. 16C shows the wire bonding structure in the case where the wire strip 4 has not been deformed. FIG. 17 is a view of a wire bonding structure as viewed in the z1 direction (plan view). Specifically, FIG. 17 shows the wire bonding structure when the wire strip 4 has a cross section shown in FIG. 16A.

In the semiconductor device A1', as shown in FIGS. 15 and 17, the longitudinal direction of each wire strip 4 is identical with the direction in which the second line portion 323 of the second wire 32 bonded to the wire strip 4 extends from the stitch bonding portion 322. That is, the second wire 32 is formed in such a manner that the second line portion 323 extends from the stitch bonding portion 322 along the longitudinal direction of the wire strip 4. Note that, in the present embodiment, two second wires 32 are bonded to the second wire bonding portions 222 of the second lead 2B. Since these two wires 32 differ from each other in direction in which their second line portions 323 extend from the stitch bonding portions 322, a wire strip 4 is formed for each of the two second wires 32. As shown in FIGS. 16A-16C, in the wire bonding structures of the semiconductor device A1', the second wires 32 (stitch bonding portions 322) and the wire strips 4 are deformed similarly to those shown in FIGS. 13A-13C. That is, deformation occurs also when the second wires 32 are stitch-bonded to the wire strips 4, similarly to the case where the second wires 32 are ball-bonded. The wire bonding structures of the semiconductor device A1' are not limited to those shown in FIGS. 16A-16C and may have any shape that is similar to those shown in FIGS. 16A-16C.

Also in this variation in which the second wires 32 are stitch-bonded to the wire strips 4, the same advantages as those of the foregoing embodiment can be achieved. If the second wires 32 are directly stitch-bonded to the bonding target (second wire bonding portions 222), the bonding target may be damaged due to the pressing force or ultrasonic vibration during the stitch bonding. In this variation, however, the second wires 32 are bonded to the bonding target via the wire strips 4. That is, the second wires 32 are stitch-bonded to the wire strips 4. Since the wire strips 4 have a wire diameter equal to that of the first wires 31, the wire strips 4 are thicker than a plating layer. Thus, the pressing force or ultrasonic vibration applied to the bonding target during stitch bonding can be absorbed by the wire strips 4, so that damage to the bonding target can be reduced or eliminated. Since the pressing force or ultrasonic vibration during stitch bonding can be absorbed by the wire strips 4, a bump or the like does not need to be formed. Damage to the bonding target can be reduced by reducing the pressing force or ultrasonic vibration applied during stitch bonding, but this leads to a decrease in the bonding strength. Stitch-bonding the second wires 32 to the wire strips 4 as in this variation eliminates the need for reducing the pressing force or ultrasonic vibration, so that a decrease in the bonding strength can be avoided.

Although the capillary 7 is used in the second wire forming step in the foregoing embodiment, the present disclosure is not limited to this, and a wedge tool 6 may be used instead. In this case, the second wires 32 are wedge-bonded to the wire strips 4 and the second semiconductor chip 12. Thus, each of the second wires 32 has a pair of wedge bonding portions instead of the ball bonding portion 321 and the stitch bonding portion 322. The paired wedge bonding portions are connected to each other by the second line portion 323. In such wedge bonding again, the direction in which the ultrasonic vibration is applied may need to be identical with the direction of movement during looping, similarly to the stitch bonding using the capillary 7. For this purpose, looping may be performed in such a manner that the longitudinal direction of each wire strip 4 and the direction in which ultrasonic vibration is applied during wedge bonding are identical with each other. That is, in the second wire forming step, each second wire 32 may be formed in such a manner that the direction in which the second line portion 323 extends from the wedge bonding portion of the second wire 32 bonded to the wire strip 4 and the longitudinal direction of the wire strip 4 are identical with each other. With this arrangement, the direction in which the ridge of the wire strip 4 extends and the direction in which the second line portion 323 extends from the wedge bonding portion of the second wire 32 bonded to the wire strip 4 correspond to each other. Thus, the bonding strength between the second wire 32 and the wire strip 4 is enhanced. In this variation again, similarly to the case of stitch bonding, if the second wire 32 is directly wedge-bonded to the bonding target (second wire bonding portion 222), the bonding target may be damaged due to the pressing force or ultrasonic vibration during the wedge bonding. Similarly to the case of stitch bonding, wedge bonding the second wire 32 via the wire strip 4 as in this variation can reduce or eliminate such damage to the bonding target without forming a bump or the like. Further, a decrease in the bonding strength can be avoided.

Figure 18A:
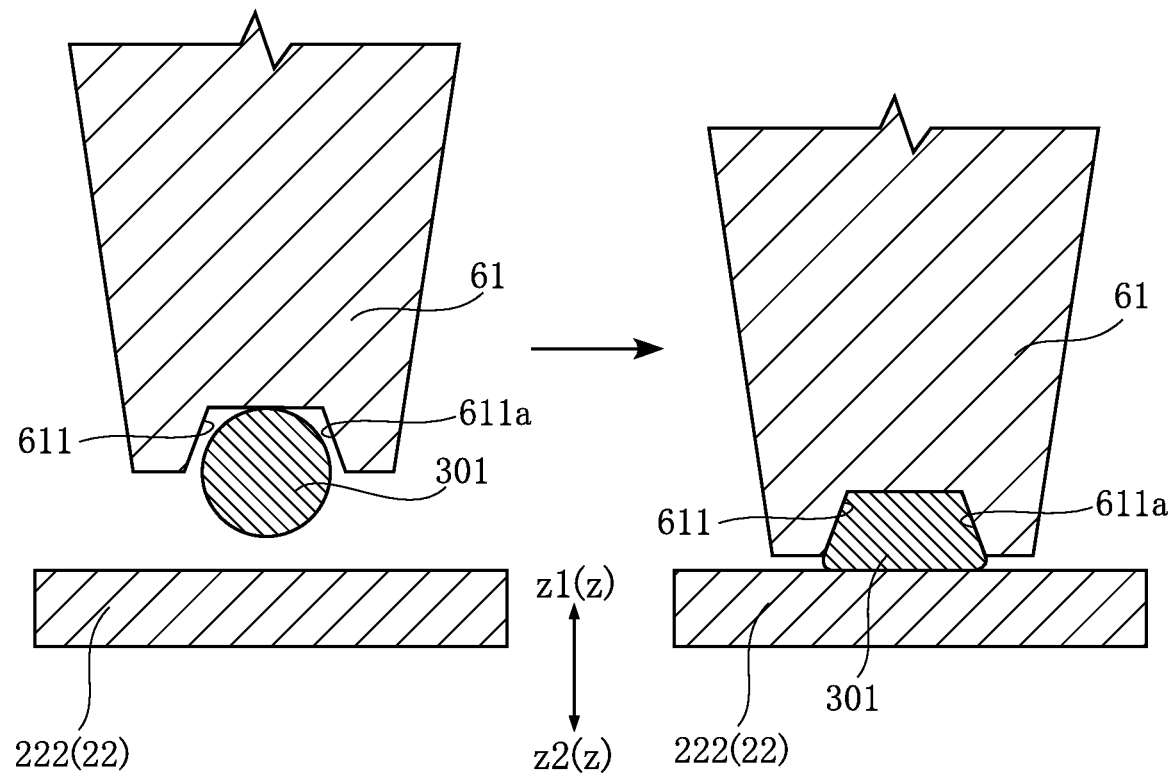
FIG. 18A shows a wedge tool according to a variation.
Figure 18B:
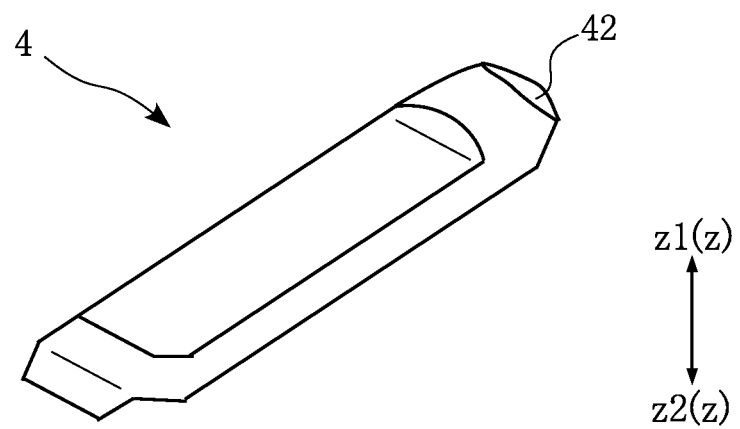
FIG. 18B shows a wire strip formed by the wedge tool.

Although the guide groove 611 of the wedge 61 of the wedge tool 6 has a V-shaped cross section in the foregoing embodiment, the present disclosure is not limited to this. For example, as shown in FIG. 18A, the guide groove 611 may have a trapezoidal cross section. In this case, as shown in FIG. 18A, in wedge bonding the first wiring material 301, the first wiring material 301 is crushed along the guide groove 611 having such a trapezoidal cross section. The wire strip 4 formed by using such a wedge 61 has a flat upper surface (the surface facing in the z1 direction) as shown in FIG. 18B. This facilitates bonding of the second wire 32 to the wire strip 4.

Although a wiring material that is circular in cross section perpendicular to the longitudinal direction is used as the first wiring material 301 in the foregoing embodiment, a wiring material in the form of a ribbon may be used. In this case, each wire strip 4, which is formed of the ribbon-like wiring material, has a flat surface facing in the z1 direction. This also facilitates bonding of the second wire 32 to the wire strip 4.

Although the wire strips 4 are formed by wedge bonding using the wedge tool 6 in the foregoing embodiment, the present disclosure is not limited to this. For example, the wire strips 4 may be formed by using the capillary 7. For example, each wire strip 4 may be formed on a second wire bonding portion 222 into a shape similar to a bump used for flip chip bonding or the like. The wire strip 4 may be bonded to the second wire bonding portion 222 by stitch bonding.

Although the wedge tool 6 is used for the first wire forming step in the foregoing embodiment, the present disclosure is not limited to this, and the capillary 7 may be used instead. In this case, in the first wire forming step, the first wiring material 301 is ball-bonded to a first semiconductor chip 11, and then stitch-bonded to the lead frame 2 (first wire bonding portion 221) after looping. Thus, the first wire 31 has a ball bonding portion formed by ball bonding instead of the wedge bonding portion 311, and a stitch bonding portion formed by stitch bonding instead of the wedge bonding portion 312. In this case, the stitch bonding portion corresponds to an example of a "first bonding portion". Contrary to the above, in the first wire forming step, the first wiring material 301 may be ball-bonded to the lead frame 2 (first wire bonding portion 221) and then stitch-bonded to a first semiconductor chip 11 after looping. In this case, the first wire 31 has stitch bonding portion formed by stitch bonding instead of the wedge bonding portion 311, and a ball bonding portion formed by ball bonding instead of the wedge bonding portion 312. In this case, the ball bonding port ion corresponds to an example of a "first bonding portion". When the first wires 31 are formed by using a capillary 7, the wire strips 4 may also be formed by using the capillary 7.

In the foregoing embodiment, anodic oxidation treatment for forming an anodic oxide film may further be performed between the wire bonding process and the resin molding process. In this case, the anodic oxide film is formed on the surfaces of the portions made of a material mainly composed of aluminum (electrode pads 113, first wires 31, wire strips 4), so that corrosion resistance of these portions is enhanced.

Although the semiconductor chips 1 are described as including a plurality of first semiconductor chips 11 and the second semiconductor chip 12 in the foregoing embodiment, the present disclose is not limited to this. Also, although the lead frame 2 is described as having the first to the ninth leads 2A-2I (nine leads), the present disclosure is not limited to this. That is, the present disclosure is applicable to various types of semiconductor devices that use multiple types of wires, and the number or types of the semiconductor chips 1, the shape of the lead frame 2 or the number of leads may be changed depending on the desired function of the semiconductor device A1. Further, the semiconductor device may not have a lead frame structure but may be a chip-type semiconductor device for surface-mounting.

The semiconductor device and the manufacturing method of the semiconductor device according to the present disclosure is not limited to the above-described embodiments. The specific configuration of each part of the semiconductor device and the manufacturing method of the semiconductor device according to the present disclosure may be varied in design in many ways.

The present disclosure includes the following Clauses.

Clause A1.
A semiconductor device comprising:
a semiconductor element;
a bonding target electrically connected to the semiconductor element;
a first wire made of a first metal, the first wire including:
a first bonding portion bonded to the bonding target;
and a first line portion extending from the first bonding portion;
a wire strip made of the first metal and bonded to the bonding target; and
a second wire made of a second metal different from the first metal, the second wire including:
a second bonding portion bonded to the bonding target via the wire strip; and
a second line portion extending from the second bonding portion.

Clause A2.
The semiconductor device according to clause A1, wherein the second bonding portion is spaced apart from the bonding target.

Clause A3.
The semiconductor device according to clause A1 or A2, wherein each of the first bonding portion and the wire strip is bonded by wedge bonding using a wedge tool, and each of the first bonding portion and the wire strip has a press trace formed during the bonding.

Clause A4.
The semiconductor device according to clause A3, wherein the wire strip has a substantially same shape as that of the first bonding portion.

Clause A5.
The semiconductor device according to any one of clauses A1 to A4, wherein the second bonding portion is a ball bonding portion bonded by ball bonding.

Clause A6.
The semiconductor device according to any one of clauses A1 to A4, wherein the second bonding portion is a stitch bonding portion bonded by stitch bonding.

Clause A7.
The semiconductor device according to clause A6, wherein the wire strip has an elongated shape, and
a direction in which the second line portion extends from the stitch bonding portion is identical with a longitudinal direction of the wire strip.

Clause A8.
The semiconductor device according to any one of clauses A1 to A7, wherein a bonding strength between the bonding target and each of the first wire and the wire strip is greater than a bonding strength, in a case where the second wire is directly bonded to the bonding target, between the bonding target and the second wire, and
a bonding strength between the wire strip and the second wire is greater than a bonding strength, in a case where the second wire is directly bonded to the bonding target, between the bonding target and the second wire.

Clause A9.
The semiconductor device according to any one of clauses A1 to A8, wherein the first wire has a wire diameter that is larger than a wire diameter of the second wire.

Clause A10.
The semiconductor device according to any one of clauses A1 to A9, wherein the bonding target includes a first bonding target portion and a second bonding target portion, the first bonding portion being bonded to the first bonding target portion, the second bonding portion being bonded to the second bonding target portion via the wire strip, and
the first bonding target portion and the second bonding target portion have respective outermost layers that are made of a same material.

Clause A11.
The semiconductor device according to clause A10, wherein the first bonding target portion and the second bonding target portion each are plated with nickel.

Clause A12.
The semiconductor device according to clause A11, wherein the first metal is mainly composed of aluminum, and
the second metal is mainly composed of gold or copper.

Clause A13.
A method for manufacturing a semiconductor device, comprising:
forming a wire strip by bonding a part of a first wiring material to a bonding target, the first wiring material being made of a first metal,
forming a first wire by using the first wiring material, the first wire including a first bonding portion bonded to the bonding target and a first line portion extending from the first bonding portion, and forming a second wire by using a second wiring material made of a second metal different from the first metal, the second wire including a second bonding portion bonded to the wire strip and a second line portion extending from the second bonding portion.

Clause A14.

The manufacturing method according to clause A13, wherein forming the wire strip comprises forming the wire strip by using a wedge tool, the wedge tool including a wire guide, a wedge that presses the first wiring material fed by the wire guide against a bonding object, and a cutter that cuts the first wiring material, and forming the first wire comprises forming the first wire by using the wedge tool.

Clause A15.

The manufacturing method according to clause A14, wherein forming the wire strip comprises:

applying ultrasonic vibration with a part of the first wiring material pressed against the bonding target with the wedge to bond the part of the first wiring material to the bonding target, and cutting the first wiring material so as to leave the part of the first wiring material to form the wire strip.

Clause A16.

The manufacturing method according to any one of clauses A13 to A15, wherein forming the second wire comprises:

forming the second bonding portion by melting the second wiring material projecting from a tip of a capillary to form a molten ball and pressing the molten ball against the wire strip for bonding;

forming the second bonding line by moving the capillary after the forming the second bonding portion while allowing the second wiring material to be drawn from the capillary; and pressing the second wiring material after the forming the second bonding portion against the semiconductor element for bonding.

Clause A17.

The manufacturing method according to any one of clauses A13 to A15, wherein forming the second wire comprises:

melting the second wiring material projecting from a tip of a capillary to form a molten ball and pressing the molten ball against the semiconductor element for bonding;

forming the second line portion by moving the capillary after the melting the second wiring material while allowing the second wiring material to be drawn from the capillary; and forming the second bonding portion by pressing the second wiring material after the forming the second line portion by moving the capillary against the wire strip for bonding.

Clause A18.

The manufacturing method according to clause A17, wherein the wire strip has an elongated shape, and forming the second wire comprises forming the second wire in such a manner that a direction in which the second line portion extends form the second bonding portion is identical with a longitudinal direction of the wire strip.

Clause A19.

The manufacturing method according to any one of clauses A13 to A18, wherein, the first metal is made of a metal that has a bonding strength with the bonding target that is greater than a bonding strength between the second metal and the bonding target and that has a bonding strength with the second metal that is greater than a bonding strength between the second metal and the bonding target.

Clause A20.

The manufacturing method according to any one of clauses A13 to A19, wherein the first wire has a wire diameter that is larger than a wire diameter of the second wire.

Clause A21.

The manufacturing method according to any one of clauses A13 to A20, wherein the bonding target includes a first bonding target portion and a second bonding target portion, the first bonding portion being bonded to the first bonding target portion, the second bonding portion being bonded to the second bonding target portion via the wire strip, and the first bonding target portion and the second bonding target portion have respective outermost layers that are made of a same material.

Clause A22.

The manufacturing method according to clause A21, further comprising plating both the first bonding target portion and the second bonding target portion with nickel.

Clause A23.

The manufacturing method according to clause A22, wherein a metal mainly composed of aluminum is used as the first metal, and a metal mainly composed of gold or copper is used as the second metal.

Figure 19:
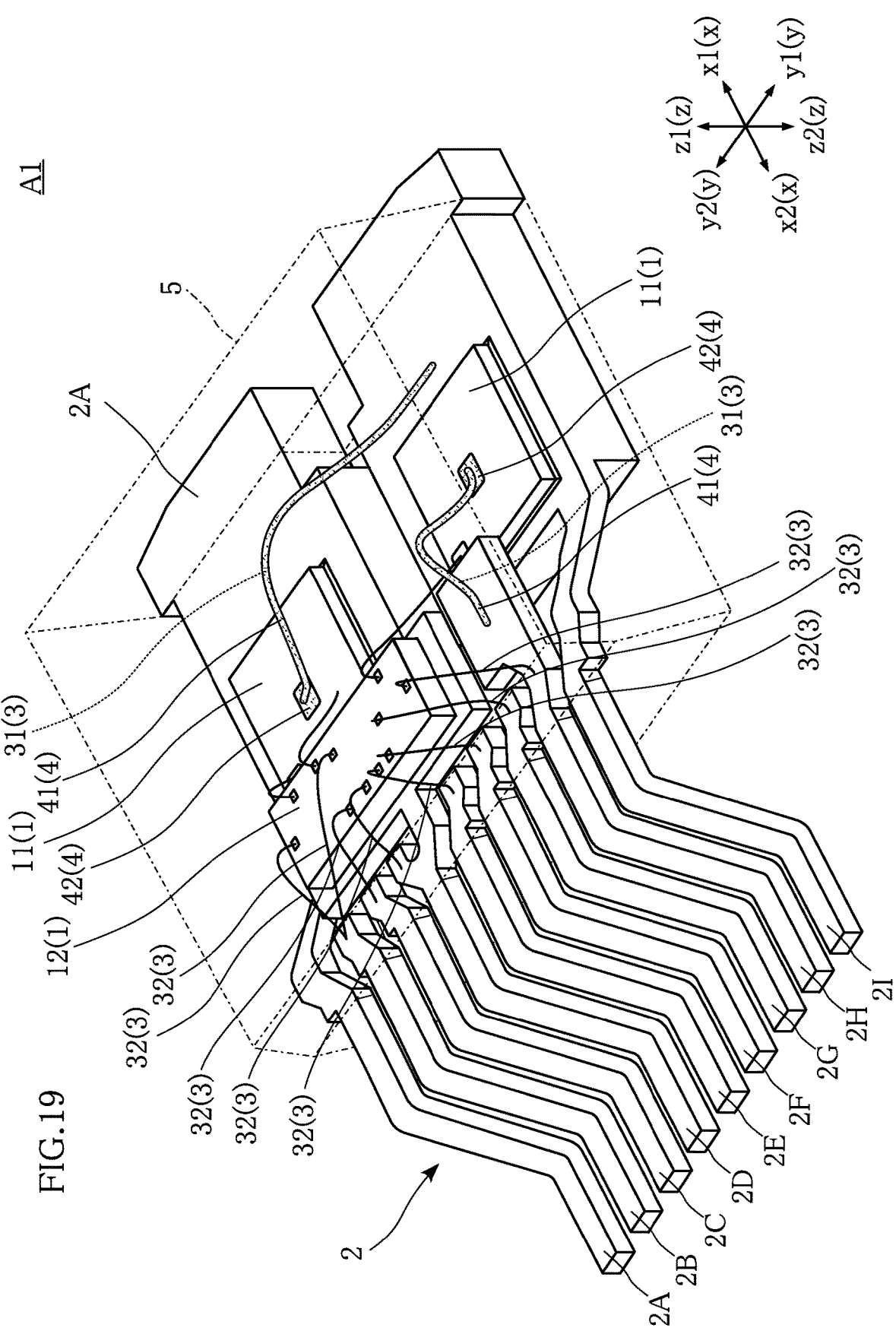
FIG. 19 is a perspective view showing a semiconductor device according to an embodiment of the present disclosure.
Figure 20:
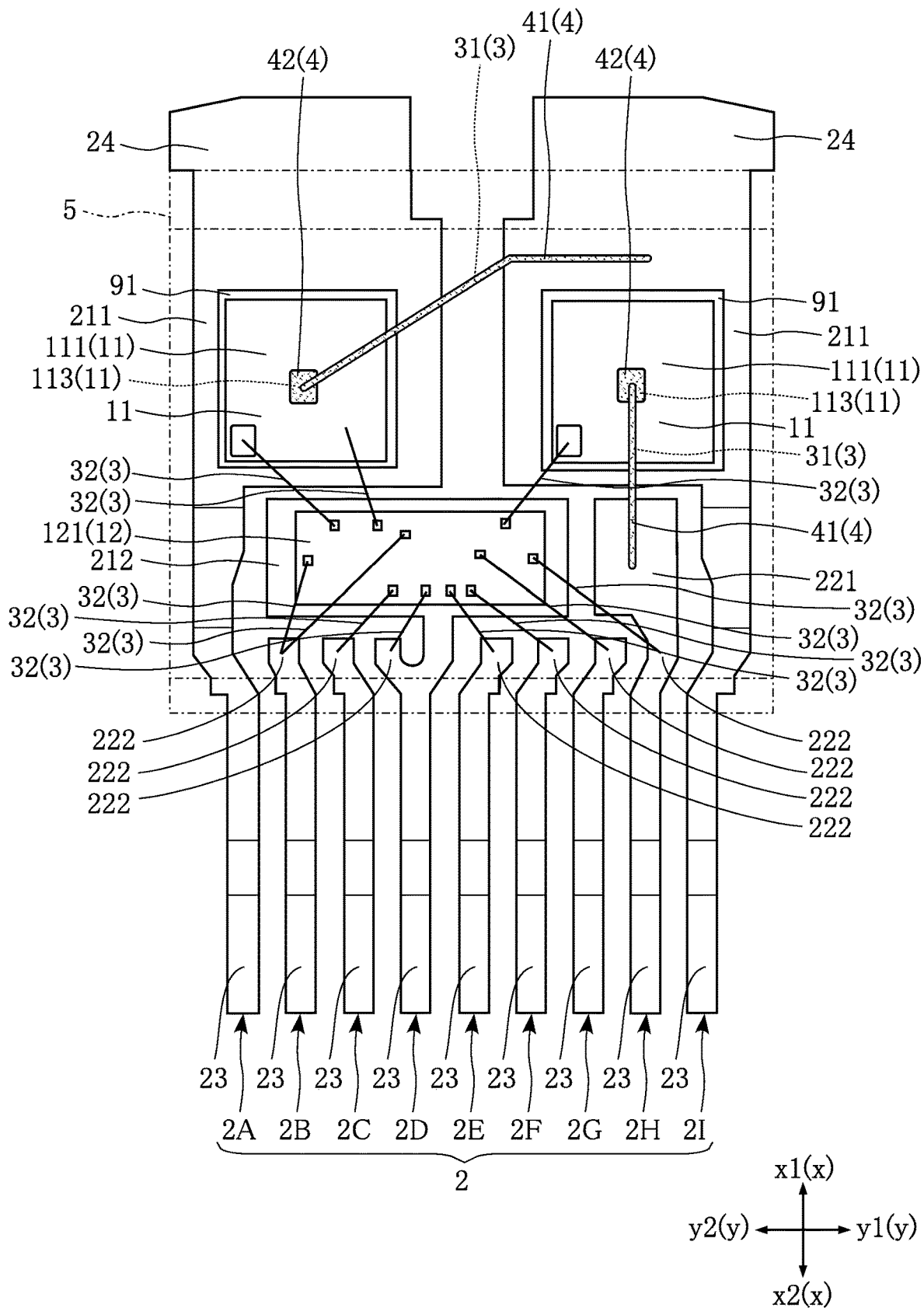
FIG. 20 is a plan view showing the semiconductor device according to an embodiment of the present disclosure.
Figure 21:
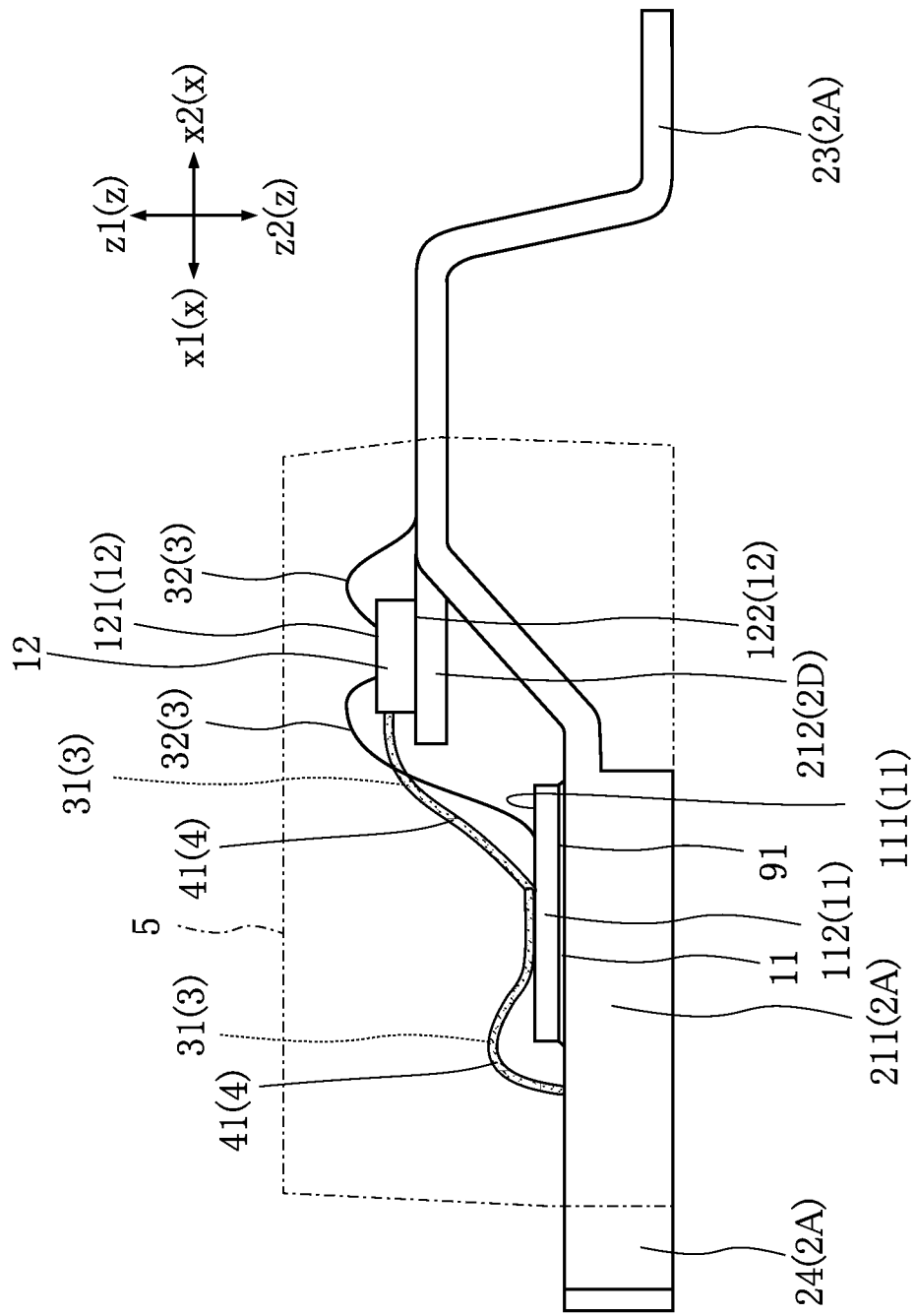
FIG. 21 is a side view showing the semiconductor device according to an embodiment of the present disclosure.
Figure 22:
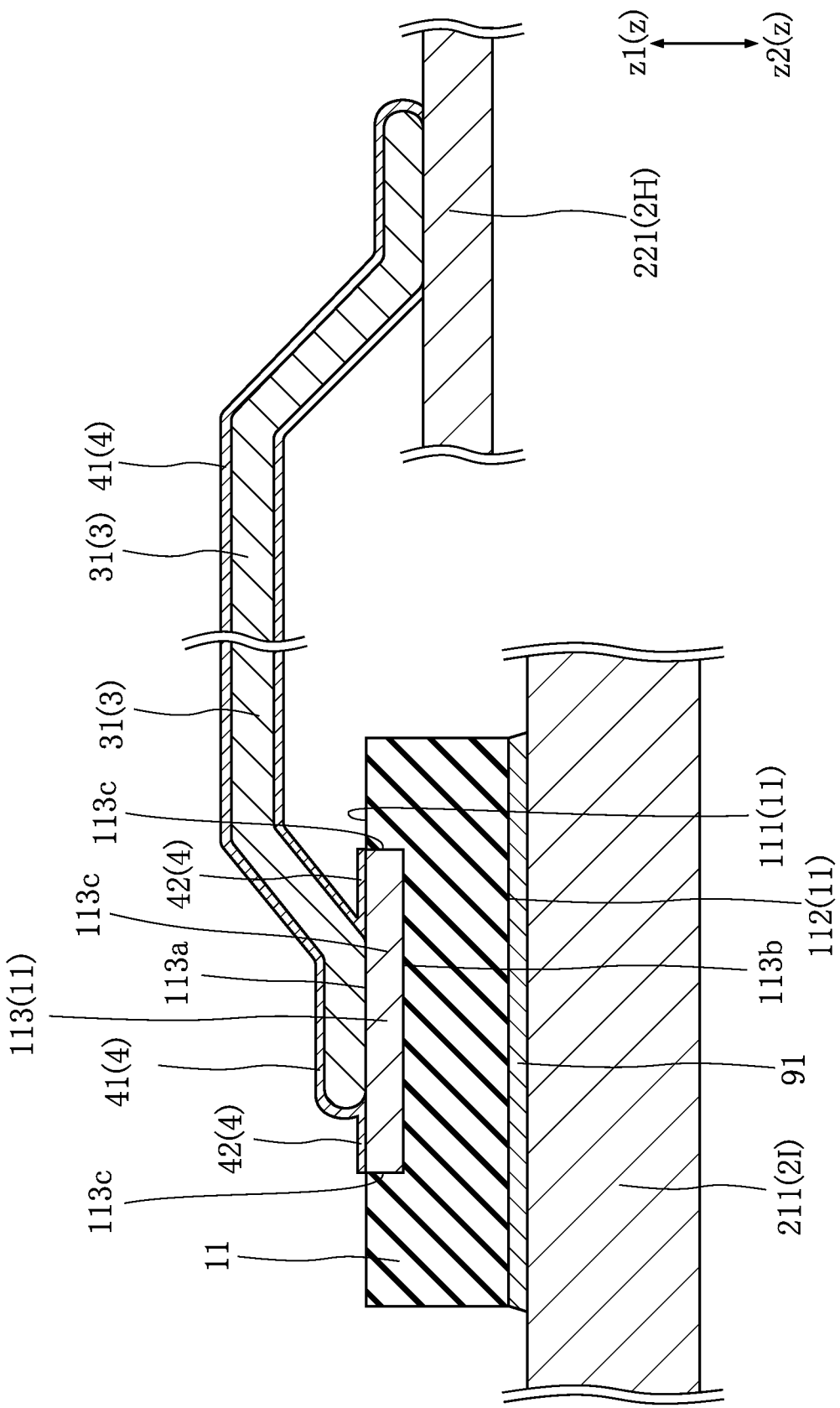
FIG. 22 is an enlarged sectional view showing a part of the semiconductor device according to an embodiment of the present disclosure.

FIGS. 19-22 show a semiconductor device A1 according to another embodiment of the present disclosure. The semiconductor device A1 of the present disclosure may be mounted on an electrical circuit board for automobiles or electronic equipment. The semiconductor device A1 includes a plurality of semiconductor chips 1, a lead frame 2, and a plurality of wires 3, an anodic oxide film 4 and a resin package 5. FIG. 19 is a perspective view of the semiconductor device A1. FIG. 20 is a plan view of the semiconductor device A1. FIG. 21 is a side view of the semiconductor device A1, showing the side surface as viewed from the left side in FIG. 20. FIG. 22 is an enlarged sectional view showing apart of the semiconductor device A1. In FIGS. 19-21, the anodic oxide film 4 is indicated by hatching, the resin package 5 is shown by phantom lines. In FIG. 22, illustration of the resin package 5 is omitted. For convenience of understanding, the following description will be made with reference to an orthogonal coordinate system defined by an x direction, a y direction, and a z direction that are orthogonal to each other. The z direction corresponds to the thickness direction of the semiconductor device A1.

Each of the semiconductor chips 1 is a circuit element made of a semiconductor material and an electronic component that performs the main function of the semiconductor device A1. In the present embodiment, the semiconductor device A1 includes a plurality of first semiconductor chips 11 and a second semiconductor chip 12, as the plurality of semiconductor chips 1.

Each of the first semiconductor chips 11 is rectangular as viewed in plan. For example, each of the first semiconductor chips 11 is a power chip such as IGBT (Insulated Gate Bipolar Transistor), a MOSFET (Metal Oxide Semiconductor Field Effect Transistor), or a diode. However, the first semiconductor chips are no limited to these. In the present embodiment, the semiconductor device A1 includes two first semiconductor chips 11. Each first semiconductor chip 11 includes a chip obverse surface 111 and a chip reverse surface 112. The chip obverse surface 111 faces in the z1 direction. The chip reverse surface 112 faces in the z2 direction. Each of the first semiconductor chips 11 has an electrode pad 113.

Each electrode pad 113 is made of pure aluminum. Each electrode pad 113 may be an aluminum alloy. Each electrode pad 113 includes a pad obverse surf ace 113a, a pad reverse surface 113b and pad side surfaces 113c. The pad obverse surface 111 faces in the z1 direction. In the present embodiment, the pad obverse surface 113a is rectangular as viewed in plan. The pad reverse surface 113b faces in the z2 direction. The pad side surfaces 113c include a surface facing in the x1 direction, a surface facing in the x2 direction, a surface facing in the y1 direction, and a surface facing in the y2 direction. In each of the first semiconductor chips 11, the pad obverse surface 113a forms a part of the chip obverse surface 111. That is, the pad obverse surface 113a and the chip obverse surface 111 are at the same position in the z direction. Note, however, that the pad obverse surface 113a and the chip obverse surface 111 may be at different positions in the z direction. A wire 3 (aluminum wire 31 described later) is bonded to the pad obverse surface 113a.

The second semiconductor chips 12 is rectangular as viewed in plan. For example, the second semiconductor chip 12 is an LSI chip such as a control IC. However, the second semiconductor chip is not limited to this. In the present embodiment, the semiconductor device A1 has a single second semiconductor chip 12. The second semiconductor chip 12 includes a chip obverse surface 121 and a chip reverse surface 122. The chip obverse surface 121 faces in the z1 direction. The chip reverse surface 122 faces in the z2 direction. A plurality of wires 3 (gold wires 32 described later) are bonded to the chip obverse surface 121.

The lead frame 2 is made of an electrically conductive material. Examples of such an electrically conductive material include Cu. The lead frame 2 is bonded to an electrical circuit board, forming a conduction path between the semiconductor chips 1 and the electrical circuit board. The lead frame 2 includes a plurality of die bonding portions 21, a plurality of wire bonding portions 22, a plurality of terminal portions 23, and a plurality of heat dissipating portions 24.

The die bonding portions 21 support the semiconductor chips 1, respectively. Each of the die bonding portions 21 has a plate-like shape along the x-y plane. In the present embodiment, the die bonding portions 21 include a plurality of first die bonding portions 211 and a second die bonding portion 212.

On each of the first die bonding portions 211, a first semiconductor chip 11 is bonded. As viewed in the z direction, each of the first die bonding portions 211 is larger than the outline of the first semiconductor chip 11. In the present embodiment, the lead frame 2 has two first die bonding portions 211. On the second die bonding portion 212, the second semiconductor chip 12 is bonded. As viewed in the z direction, the second die bonding portion 212 is larger than the outline of the second semiconductor chip 12. In the present embodiment, the lead frame 2 has the single second die bonding portion 212. The second die bonding portion 212 is positioned in the z1 direction relative to each first die bonding portion 211.

In the present embodiment, a bonding layer 91 is interposed between each first die bonding portion 211 and the first semiconductor chip 11 supported by the first die bonding portion. The bonding layer 91 is made of an electrically conductive material. For example, the electrically conductive material may be solder or silver paste. Solder has a relatively large thermal conductivity. Using solder for the bonding layer 91 allows heat to be efficiently conducted from the first semiconductor chips 11 to the first die bonding portions 211. Though not illustrated, a predetermined bonding layer is also interposed between the second die bonding portion 212 and the second semiconductor chip 12 supported by the second die bonding portion 212.

The wire bonding portions 22 support the wires 3, respectively. In the present embodiment, the wire bonding portions 22 include a plurality of first wire bonding portions 221 and a plurality of second wire bonding portions 222.

On each of the first wire bonding portion 221, an aluminum wire 31 (described later) is bonded. Each of the first wire bonding portions 221 is plated with Ni in view of bonding with the aluminum wire 31. In the present embodiment, the lead frame 2 has two first wire bonding portions 221. On each of the second wire bonding portions 222, a gold wire 32 (described later) is bonded. Each of the second wire bonding portions 222 is plated with Ag in view of bonding with the gold wire 32. In the present embodiment, the lead frame 2 has seven second wire bonding portions 222.

The plurality of terminal portions 23 are terminals for providing electrical connection to an electrical circuit board. That is, the terminal portions 23 function as connector pins of the semiconductor device A1. Each of the terminal portions 23 is exposed from the resin package 5. The terminal portions 23 are arranged side by side in the y direction. The terminal portions 23 are positioned in the x2 direction relative to the resin package 5. Each terminal portion 23 is bent. In the present embodiment, the lead frame 2 has nine terminal portion 23.

Each of the heat dissipating portions 24 functions to dissipate heat generated at the semiconductor chip 1 to the outside. Each heat dissipating portion 24 is exposed from the resin package 5. In the present embodiment, each heat dissipating portion 24 is connected to a corresponding first die bonding portion 211. As viewed in plan, the heat dissipating portions 24 are arranged side by side in the y direction and positioned in the x1 direction relative to the resin package 5. In the present embodiment, since the first semiconductor chips 11 are power chips, they generate a large amount of heat. Thus, the heat dissipating portions 24 are provided to dissipate the heat generated mainly at the first semiconductor chips 11. In the present embodiment, the lead frame 2 has two heat dissipating portions 24. The heat dissipating portions 24 may be part of the lead frame 2 or may be a different member bonded to the lead frame 2.

The lead frame 2 includes a plurality of leads. In the present embodiment, the semiconductor device A1 includes, as the lead frame 2, nine leads (a first to a ninth leads 2A-2I) separate from each other.

The first lead 2A has a terminal portion 23, a first die bonding portion 211 and a heat dissipating portion 24, which are connected and integrally formed with each other. As shown in FIGS. 19 and 21, the first lead 2A is bent at a portion connecting the terminal portion 23 and the first die bonding portion 211 to each other. The first lead 2A supports a first semiconductor chip 11.

The second lead 2B includes a terminal portion 23 and a second wire bonding portion 222, which are connected to and integrally formed with each other. A gold wire 32 is bonded to the second lead 2B. The third lead 2C, the fifth lead 2E, the sixth lead 2F and the seventh lead 2G are similar to the second lead 2B.

The fourth lead 2D has a terminal portion 23, a second wire bonding portion 222 and the second die bonding portion 212, which are connected to and integrally formed with each other. The fourth lead 2D supports the second semiconductor chip 12. A gold wire 32 is bonded to the fourth lead 2D.

The eighth lead 2H has a terminal portion 23, a first wire bonding portion 221, and a second wire bonding portion 222, which are connected to and integrally formed with each other. An aluminum wire 31 and a gold wire 32 are bonded to the eighth lead 2H.

The ninth lead 2I includes a terminal portion 23, a first die bonding portion 211, a first wire bonding portion 221 and a heat dissipating portion 24, which are connected to and integrally formed with each other. As shown in FIGS. 19 and 21, the ninth lead 2I is bent at a portion that connects the terminal portion 23 and the first die bonding portion 211. The ninth lead 2I supports a first semiconductor chip 11. An aluminum wire 31 is bonded to the ninth lead 2I.

Each of the wires 3 connects two of the first semiconductor chips 11, the second semiconductor chip 12, and the lead frame 2. In the present embodiment, the wires 3 include a plurality of aluminum wires 31 and a plurality of gold wires 32.

Each of the aluminum wires 31 is made of an aluminum alloy to which one of iron, silicon and nickel is added. Each aluminum wire 31 may be made of pure aluminum. Each aluminum wire 31 has one end bonded to a first semiconductor chip 11 and the other end bonded to the lead frame 2. Although each aluminum wire 31 is described as being circular in cross section perpendicular to the longitudinal direction in the present embodiment, it may be in the form of a ribbon. The wire diameter of each aluminum wire 31 may be 300 to 400 μm, but is not limited to this. Each aluminum wire 31 is covered with the anodic oxide film 4. Note, however, that each aluminum wire 31 is not covered with the anodic oxide film 4 at the surface in contact with the electrode pad 113 and the surface in contact with the first wire bonding portion 221. In the present embodiment, the semiconductor device A1 has two aluminum wires 31.

Each of the gold wires 32 is made of gold. Each of the gold wires 32 has one end bonded to the second semiconductor chip 12 (chip obverse surface 121) and the other end bonded to the lead frame 2 (second wire bonding portion 222) or a first semiconductor chip 11 (chip obverse surface 111). In the present embodiment, the semiconductor device A1 has eleven gold wires 32.

Figure 23:
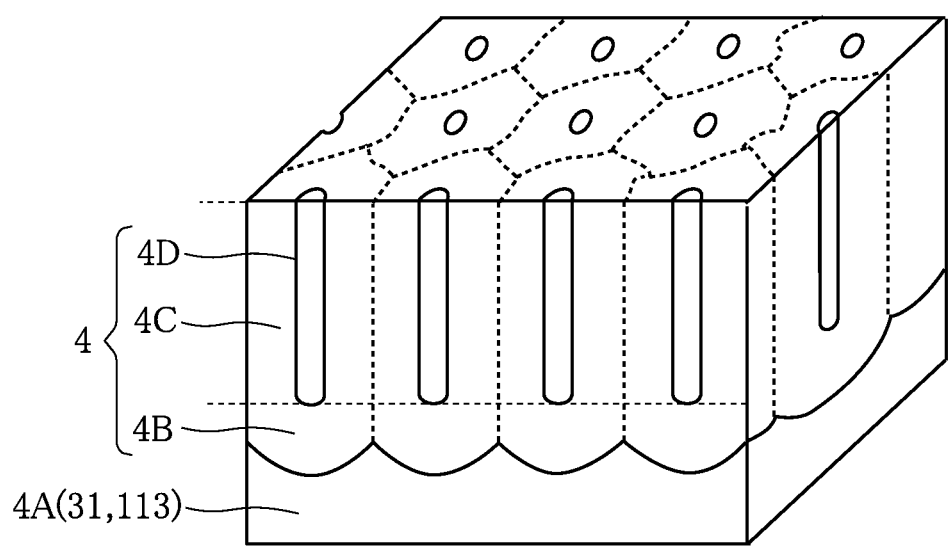
FIG. 23 is a view for explaining a laminated structure of an anodic oxide film.

The anodic oxide film 4 has a laminated structure. FIG. 23 shows the laminated structure of the anodic oxide film 4. The laminated structure of the anodic oxide film 4 includes a barrier layer 4B and a porous layer 4C. The barrier layer 4B is laminated on an aluminum wire 31 and an electrode pad 113 as an aluminum base 4A. The porous layer 4C is laminated on the barrier layer 4B. The porous layer 4C has a plurality of minute pores 4D.

The anodic oxide film 4 includes a wire covering portion 41 and a pad covering portion 42. The wire covering portion 41 covers the aluminum wires 31. The wire covering portion 41 is formed over the entire length of each aluminum wire 31. The pad covering portion 42 covers the electrode pad 113 (pad obverse surface 113a) of each first semiconductor chip 11. The pad covering portion 42 includes an edge that is parallel to an edge of the pad obverse surface 113a, and that as viewed in the z direction overlaps the edge of the pad obverse surface 113a. The wire covering portion 41 and the pad covering portion 42 are integrally formed with each other. The wire covering portion 41 is formed by growing from the surface of the aluminum wire 31 in the anodic oxidation process described later. Thus, the wire covering portion 41 is integral with the aluminum wire 31. The pad covering portion 42 is formed by growing from the surface of the electrode pad 113 in the anodic oxidation process described later. Thus, the pad covering portion 42 is integral with the electrode pad 113. In the present embodiment, the anodic oxide film 4 has a film thickness of 1000 to 2000 Å. The resin package 5 covers the semiconductor chips 1, portions of the lead frame 2, wires 3 and the anodic oxide film 4. The anodic oxide film 4 covers the aluminum wires 31. The resin package 5 covers the aluminum wires 31. The resin package 5 is made of a thermosetting synthetic resin with electrically insulating properties. In the present embodiment, the resin package 5 is made of black epoxy resin. The resin package 5 is rectangular as viewed in plan.

A method for manufacturing the semiconductor device A1 according to an embodiment of the present disclosure is described below with reference to FIGS. 24 to 27. The manufacturing method according to the present embodiment includes a first lead-frame-forming process, a die bonding process, a wire bonding process, an anodic oxidation process, a resin molding process and a second lead-frame-forming process. The semiconductor device A1 is manufactured through the above-described processes. In the present embodiment, the above-described processes are performed in the mentioned order.

Figure 24:
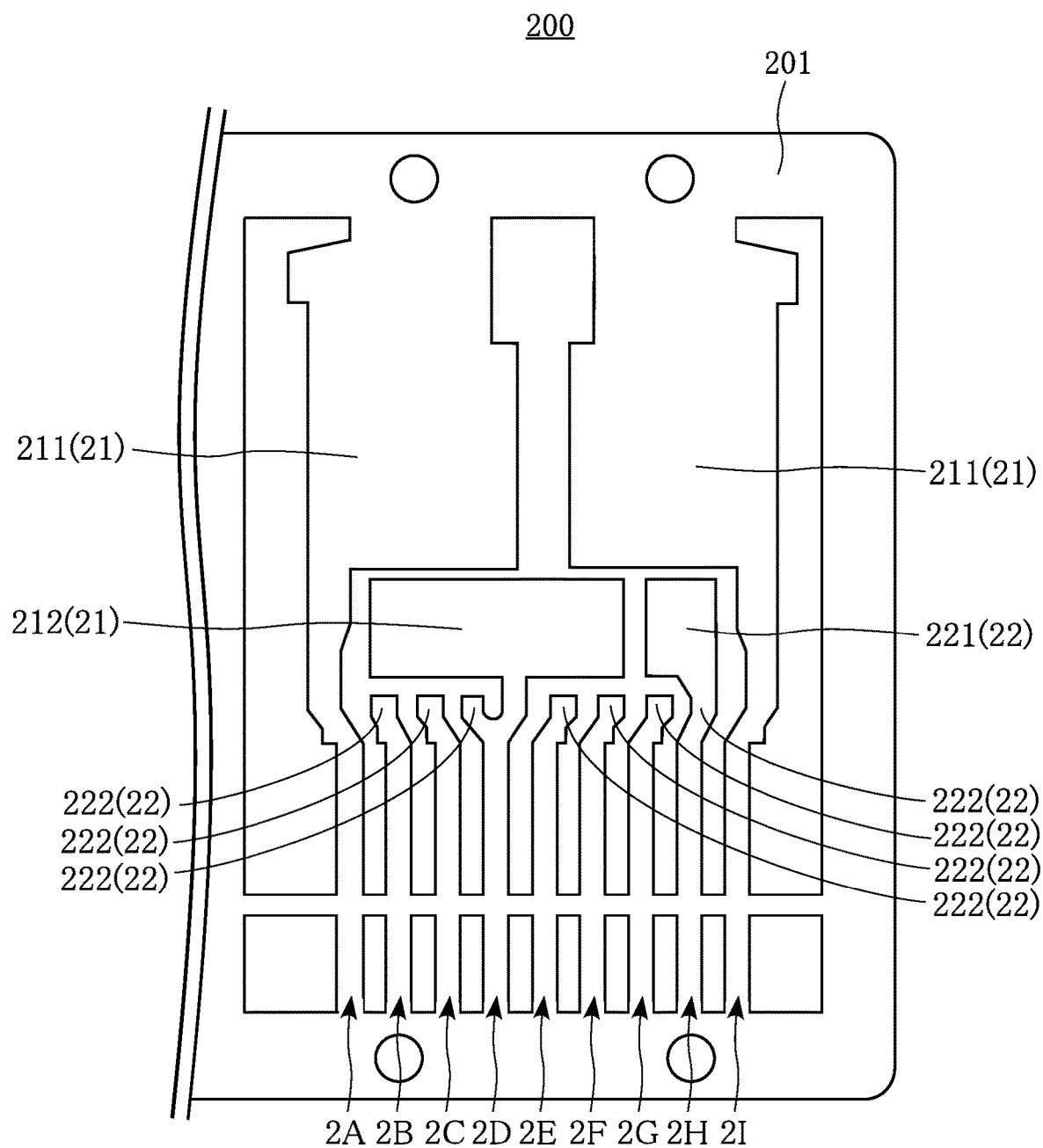
FIG. 24 shows a step of a method for manufacturing the semiconductor device according to an embodiment of the present disclosure.

In the first lead-frame-forming process, preparation is made for forming the lead frame 2 having the above-described structure. Specifically, in the first lead-frame-forming process, a copper plate is prepared and punched. The punching may be performed by a known method. In this way, the lead frame 200 shown in FIG. 24 is obtained. The lead frame 200 includes a frame 201 and a plurality of leads (first to ninth leads 2A-2I) supported by the frame 201. The first to the ninth leads 2A-2I include portions corresponding to the above-described die bonding portion 21, wire bonding portion 22, terminal portions 23 and heat dissipating portions 24. At this stage, the lead frame 200 has a plate-like shape and is not bent.

Subsequently, a bending process is performed to the lead frame 200. In the bending process, the lead frame 200 is bent in such a manner that the first die bonding portions 211 are translated in the z2 direction. As a result, the first die bonding portions 211 are positioned in the z2 direction relative to the second die bonding portion 212. Thereafter, plating is applied to required portions. In the present embodiment, the first wire bonding portions 221 are plated with Ni, and the second wire bonding portions 222 are applied with Ag. Note that, in the first lead-frame-forming process, punching and bending may be performed simultaneously.

Subsequently, in the die bonding process, the semiconductor chips 1 are die-bonded to the die bonding portions 21 of the lead frame 200. In the present embodiment, each of the first semiconductor chips 11 is placed on one of the first die bonding portions 211 via a bonding layer 91. In this way, the first semiconductor chip 11 is bonded to the first die bonding portion 211. Further, the second semiconductor chip 12 is placed on the second die bonding portion 212 via a bonding layer (not shown). In this way, the second semiconductor chip 12 is bonded to the second die bonding portion 212. The die bonding process may be performed by any method that allows the semiconductor chips 1 to be bonded at predetermined positions.

Subsequently, in the wire bonding process, the wires 3 are bonded to the lead frame 200 and the semiconductor chips 1 bonded to the lead frame 200. This wire bonding process may be performed by using a known wire bonder. In this wire bonding process, one end of each aluminum wire 31 is bonded to an electrode pad 113 (pad obverse surface 113*a*) of a first semiconductor chip 11, and the other end is bonded to a first wire bonding portion 221. Further, one end of each gold wire 32 is bonded to the second semiconductor chip 12, and the other end is bonded to a second wire bonding portion 222 or the chip obverse surface 11 of a first semiconductor chip 11. In the present embodiment, the aluminum wires 31 are bonded by wedge bonding, and the gold wires 32 are bonded by ball bonding. By the die bonding process and the wire bonding process, the lead frame 200 shown in FIG. 25 is obtained.

Figure 26:
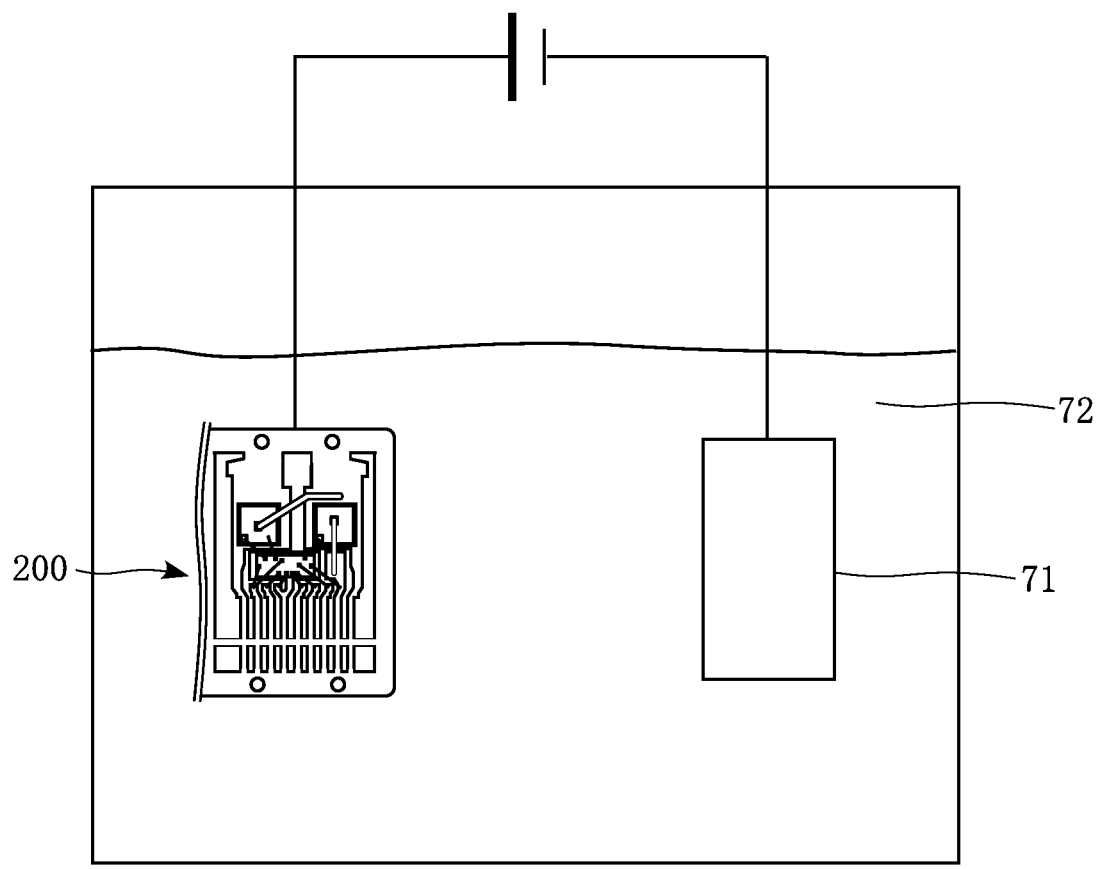
FIG. 26 shows a step (anodic oxidation process) of the method for manufacturing the semiconductor device according to an embodiment of the present disclosure.
Figure 27:
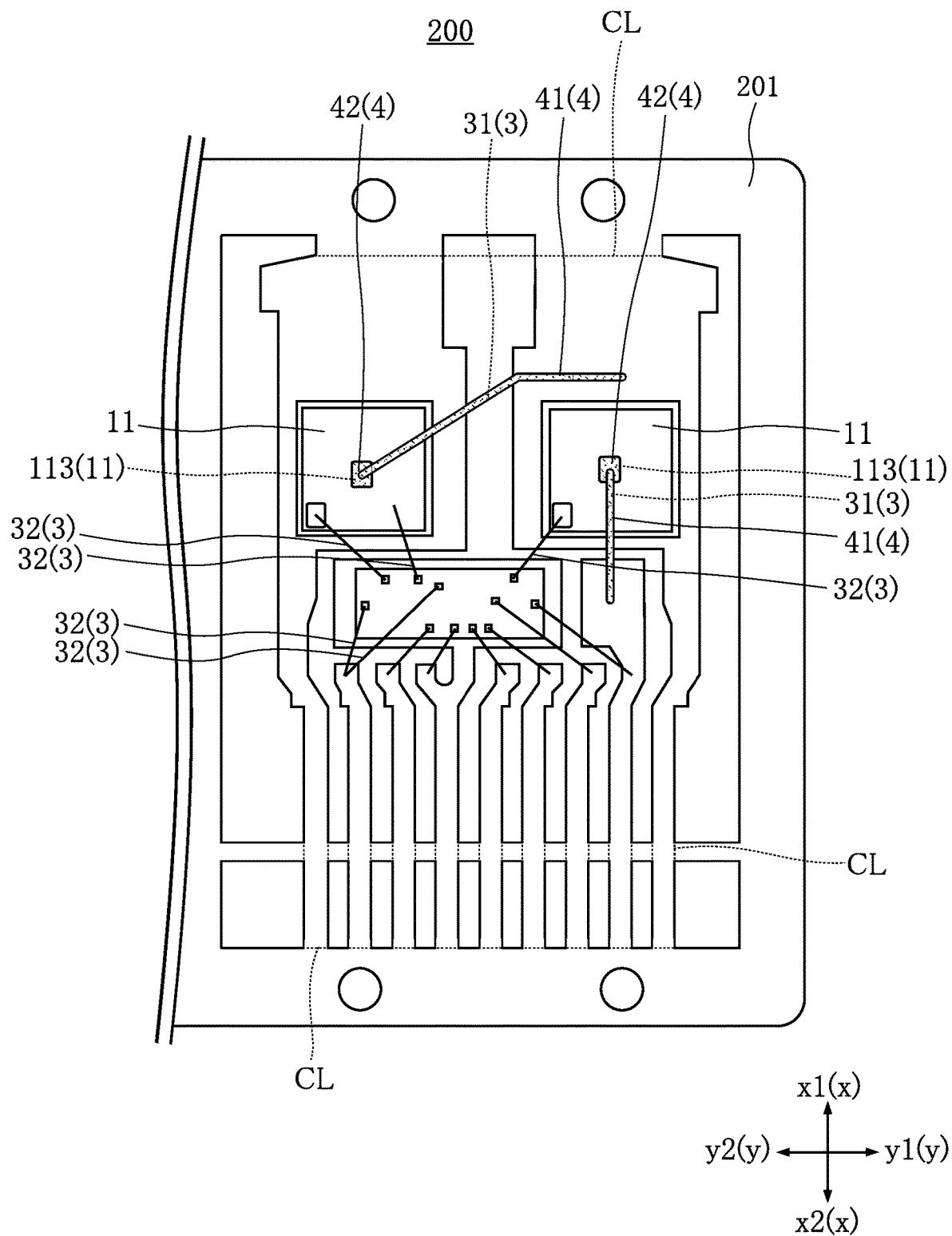
FIG. 27 shows a step of the method for manufacturing the semiconductor device according to an embodiment of the present disclosure.

In the subsequent anodic oxidation process, the lead frame 200 (see FIG. 25) after the wire bonding process is subjected to anodic oxidation treatment, whereby the anodic oxide film 4 is formed. FIG. 26 shows an example of anodic oxidation treatment. Specifically, the lead frame 200 as an anode and a cathode 71 are immersed in an electrolytic solution 72, and a voltage is applied between the anode and the cathode 71. This causes a chemical reaction to occur at portions where the aluminum wires 31 and the electrode pads 113, which are made of aluminum, are exposed, so that an oxide film (anodic oxide film 4) grows while dissolving the aluminum wires 31 and the electrode pads 113. As the oxide film grows, the barrier layer 4B and then the porous layer 4C are formed on the aluminum wires 31 and the electrode pads 113 as an aluminum base. In this process, the oxide layer grows simultaneously at the aluminum wires 31 and at the electrode pads 113, so that the wire covering portion 41 and the pad covering portion 42 are formed integrally. Such a reaction does not occur at the lead frame 2, which is made of copper, and the gold wires 32, which are made of gold. That is, the anodic oxide film 4 is not formed at the lead frame 2 and the gold wires 32. In the present embodiment, by the above-described anodic oxidation process, the lead frame 200 shown in FIG. 27 is obtained. In FIG. 27, the portions at which the anodic oxide film 4 is formed are indicated by hatching. The film thickness of the anodic oxide film 4 depends on the conditions such as a treatment time (the immersion time in the electrolytic solution 72) or the voltage applied.

Methods of anodic oxidation can be classified, for example, by the types of the electrolytic solution 72. The classification by the types of the electrolytic solution 72 include an acidic bath type, an alkaline bath type, an organic acid bath type, and a hard film type. Although an alkaline solution is used as the electrolytic solution 72 in the present embodiment, the electrolytic solution is not limited to this. Examples of such an alkaline solution (electrolytic solution 72) include solutions of ammonium fluoride, alkali peroxide and sodium phosphate. Examples of an acidic solution used for an acidic bath type include solutions of sulfuric acid, oxalic acid, chromic acid, boric acid. Methods of anodic oxidation can also be classified by the types of voltage applied (DC voltage or AC voltage, and so on). In the present embodiment, DC voltage is applied.

In the resin molding process, the resin package 5 is formed. In the present embodiment, the resin package is formed by molding. In the resin molding process, the lead frame 200 after the anodic oxidation process (see FIG. 27) is pressed with a mold (not shown), and a resin material is injected into the cavity of the mold. The resin material is then hardened, whereby the resin package 5 is formed.

In the second lead-frame-forming process, the process for making the lead frame 200 after the resin molding process into the lead frame of the semiconductor device A1 shown in FIGS. 19-21 is performed. Specifically, in the second lead-frame-forming process, a cutting (cutting-out) process and a bending process are performed. In the cutting process, cutting is performed along the cutting lines CL (dotted lines) shown in FIG. 27 and so on, to remove the portions connecting the first to ninth leads 2A-2I and the frame 201. In the bending process, bending is performed in such a manner that the ends of the first to ninth leads 2A-2I in the x2 direction are translated in the z2 direction relative to the portions (terminal portions 23) projecting from the resin package 5. In this way, the terminal portions 23 are formed into a bent shape.

By conducting the above-described processes in order, the semiconductor device A1 shown in FIGS. 19-22 is obtained.

According to the present embodiment, each aluminum wire 31 is covered with the anodic oxide film 4 (wire covering portion 41). Thus, each aluminum wire 31 is protected by the anodic oxide film 4. Experiments by the inventor have revealed that pitting corrosion with respect to a temperature cycle can be reduced or eliminated by the anodic oxide film 4. Thus, bonding failure or disconnection due to damage to the aluminum wires 31 can be reduced or eliminated. That is, the reliability of the semiconductor device A1 with respect to a temperature cycle can be enhanced. Aluminum forms a natural oxide film (aluminum oxide film) due to its contact with air, which can enhance corrosion resistance. However, the film thickness of such a natural oxide film is very small and cannot be increased. For example, a natural oxide film has a film thickness of about 50 to 200 Å. Thus, enhancement of corrosion resistance is limited. On the other hand, the film thickness of the anodic oxide film 4 is about 1000 to 2000 Å as described above, which is much thicker than the natural oxide film. Thus, corrosion resistance is more enhanced as compared with the case where a natural oxide film is formed on the aluminum wires 31.

According to the present embodiment, the entirety of the lead frame 200 after the die bonding process and the wire bonding process is immersed in the electrolytic solution 72 in the anodic oxidation process (see FIG. 26). This allows the anodic oxide film 4 to be formed not only on the aluminum wires 31 but also on the electrode pads 113, which is mainly composed of aluminum (pad covering portion 42). Since the pad obverse surfaces 113*a* of the electrode pads 113 are also protected by the anodic oxide film 4, corrosion of the pad obverse surfaces 113*a* is also reduced or eliminated. Corrosion of the pad obverse surface 113*a* of an electrode pad 113 may spread to both the pad side surfaces 113*c* and the pad reverse surface 113*b* through boundary surfaces of the electrode pad 113. This may degrade the bonding strength of the electrode pad 113 and cause the electrode pad 113 to be detached from the first semiconductor chip 11. Since the pad obverse surface 113*a* of each electrode pad 113 is protected by the anodic oxide film 4 (pad covering portion 42) according to the present embodiment, spreading of corrosion to the pad side surfaces 113*c* and the pad reverse surface 113*b* is prevented. Thus, detachment of the electrode pad 113 is prevented.

According to the present embodiment, the wire covering portion 41 and the pad covering portion 42 of the anodic oxide film 4 are integrally formed. This enhances the bonding strength between the aluminum wires 31 and the first semiconductor chips 11 (electrode pads 113).

According to the present embodiment, the wire bonding process is performed before the anodic oxidation process. An aluminum wire 31 subjected to anodic oxidation treatment (aluminum wire 31 covered with the anodic oxide film 4) cannot be bonded due to the influence by the anodic oxide film 4. To bond such a wire, the anodic oxide film 4 needs to be removed, which requires a troublesome work. By wire bonding the aluminum wire 31 before the anodic oxide film 4 is formed, a conventional method for bonding an aluminum wire can be used, so that a troublesome work is not necessary.

According to the present embodiment, an alkaline electrolytic solution 72 is used in the anodic oxidation treatment. The entirety of the lead frame 200 is immersed in the electrolytic solution 72 in the anodic oxidation process as shown in FIG. 26. Thus, portions other than the aluminum wires 31 are also immersed in the electrolytic solution 72. The portions other than the aluminum wires 31 include the lead frame 200(2), which is immersed in the electrolytic solution 72. Since the lead frame 200 (2) is made of copper, the lead frame 200 (2) may be deteriorated when an acidic electrolytic solution 72 is used. By using an alkaline electrolytic solution 72, corrosion of the lead frame 200 (2) is reduced as compared with the case where an acidic electrolytic solution 72 is used.

Variations of the semiconductor device A1 and its manufacturing method according to the present embodiment are described below.

Figure 28:
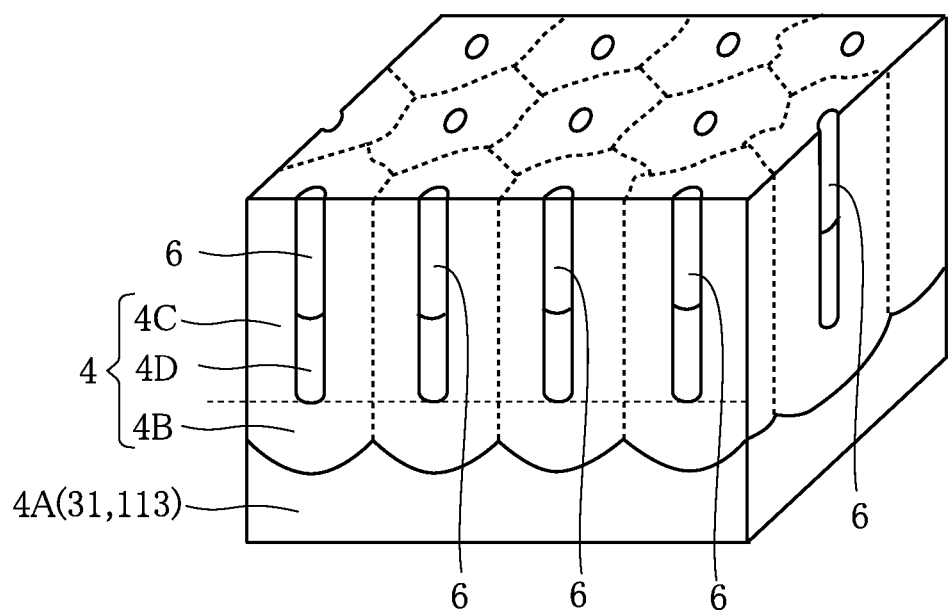
FIG. 28 shows a sealing treatment according to a variation of the present disclosure.

In the present embodiment, a treatment to seal the pores 4D in the porous layer 4C may be additionally performed after the anodic oxidation treatment. This sealing treatment is a treatment to seal the pores 4D of the porous layer 4C, which is laminated on the aluminum base 4A (aluminum wire 31 and electrode pad 113) by the anodic oxidation treatment. Examples of a sealing treatment method include hydro-thermal sealing and inorganic filling sealing. The hydro-thermal sealing is a method in which water molecules are taken into the pores 4D so that the pores 4D are sealed due to volume expansion within the pores 4D, and includes a pressurized steam sealing type (temperature: 110-140° C.) and a boiling water sealing type (temperature: 95° C. or higher). Inorganic filling sealing is a method in which metal salts of nickel, cobalt, chromium and so on or fluorides of these metal salts are adsorbed adjacent to the openings of the pores 4D as a hydroxide of the metal salt to seal the pores 4D. Inorganic filling sealing includes a two-step sealing type that uses a metal salt and a low-temperature sealing type in which a fluoride is allowed to coexist in a metal salt. FIG. 28 shows the laminated structure of the anodic oxide film 4 after the pore sealing treatment by hydro-thermal sealing. As shown in FIG. 28, as compared with FIG. 23, a hydrate 6 is formed by the pore-sealing process. For example, the hydrate 6 may be aluminum hydroxide. As shown in FIG. 28, the hydrate 6 fills the pores 4D at portions adjacent to their openings to seal the openings. Note that "pore sealing" includes the condition in which the openings of the pores 4D are not completely sealed but just narrowed. Since the hydrate 6 fills the pores at portions adjacent to their openings as described above, the thickness does not change between the case where only the anodic oxidation treatment is performed and the case where the pore sealing treatment is additionally performed. Note that the hydrate 6 may be formed on the porous layer 4C. By performing the above-described pore sealing treatment, the surface of the anodic oxide film 4 is more stabilized (deactivated) so that it does not easily react with oxygen or other chemical substances. Thus, corrosion resistance of the aluminum wires 31 is further enhanced.

In the foregoing embodiment, the anodic oxide film 4 is described as having a porous layer 4C formed with pores 4D. However, depending on the method of anodic oxidation, such a porous layer 4C may not be formed. Thus, the anodic oxide film 4 may not include a porous layer 4C.

Although the semiconductor chips 1 are described as including a plurality of first semiconductor chips 11 and the second semiconductor chip 12 in the foregoing embodiment, the present disclose is not limited to this. Also, although the lead frame 2 is described as having the first to the ninth leads 2A-2I (nine leads), the present disclosure is not limited to this. The number or types of the semiconductor chips 1, the shape of the lead frame 2 or the number of leads may be changed depending on the desired function of the semiconductor device A1. For example, when the semiconductor device A1 is a discrete semiconductor device including a MOSFET, the MOSFET may correspond to the semiconductor chip 1, and may be bonded to the lead frame 2. In this case, the number of leads (terminal portions 23) may be three.

Further, although the semiconductor device A1 having a lead frame structure is described in the foregoing embodiment, the present disclosure is applicable to various types of semiconductor devices that use a wire mainly composed of aluminum. For example, the semiconductor device may not have a lead frame structure but may be a chip-type semiconductor device for surface-mounting as long as it uses a wire mainly composed of aluminum.

The semiconductor device and the manufacturing method of the semiconductor device according to the present disclosure is not limited to the above-described embodiments. The specific configuration of each part of the semiconductor device and the manufacturing method of the semiconductor device according to the present disclosure may be varied in design many ways.

The present disclosure includes the following Clauses.

Clause B1.

A semiconductor device comprising:
    a semiconductor element;
    an aluminum wire having an end bonded to the semiconductor element,
    an anodic oxide film having a wire covering portion, the wire covering portion covering the aluminum wire, and
    a sealing resin that covers the semiconductor element and the anodic oxide film.

Clause B2.

The semiconductor device according to clause B1, wherein the semiconductor element has an electrode pad, the electrode pad being mainly composed of aluminum,
    the electrode pad has a pad obverse surface, the end of the aluminum wire being bonded to the pad obverse surface, and
    the anodic oxide film includes a pad covering portion that covers the pad obverse surface.

Clause B3.

The semiconductor device according to clause B2, wherein the wire covering portion and the pad covering portion of the anodic oxide film are integrally formed with each other.

Clause B4.

The semiconductor device according to any one of clauses B1 to B3, wherein the anodic oxide film has a porous layer formed with a plurality of pores, and the semiconductor device further includes a hydrate that
    seals the pores.
Clause B5.
    The semiconductor device according to any one of clauses
B1 to B4, wherein iron, silicon, or nickel is added to the
aluminum wire.
Clause B6.
    The semiconductor device according to any one of clauses
B1 to B5, further comprising an electrode electrically connected to the semiconductor element,
    the electrode having: a die bonding portion, wherein the
        semiconductor element is bonded to the die bonding
        portion within the sealing resin; and a terminal portion
        exposed from the sealing resin.
Clause B7.
    The semiconductor device according to clause B6,
wherein the electrode is a lead frame.
Clause B8.
    A method for manufacturing a semiconductor device,
comprising:
    bonding an end of an aluminum wire to a semiconductor
        element,
    forming an anodic oxide film that covers the aluminum
        wire, and
    forming a sealing resin that covers the semiconductor
        element and the anodic oxide film.
Clause B9.
    The manufacturing method according to clause B8,
wherein the semiconductor element has an electrode pad
mainly composed of aluminum,
    bonding the end of an aluminum wire comprises bonding
        the end of the aluminum wire to the electrode pad, and
    forming the anodic oxide film comprises forming the
        anodic oxide film that covers the electrode pad.
Clause B10.
    The manufacturing method according to clause B9,
wherein forming the anodic oxide film is performed after
bonding the end of the aluminum wire to the semiconductor
element and before forming the sealing resin.
Clause B11.
    The manufacturing method according to any one of
clauses B8 to B10, wherein bonding the end of the aluminum wire to the semiconductor element is performed by
wedge bonding.
Clause B12.
    The manufacturing method according to any one of
clauses B8 to B11, wherein the anodic oxide film has a
porous layer formed with a plurality of pores, and the
method further includes sealing the pores with a hydrate.
Clause B13.
    The manufacturing method according to any one of
clauses B8 to B12, wherein the semiconductor device further includes an electrode electrically connected to the
semiconductor element, and
    the method further includes bonding the semiconductor
        element to the electrode.
Clause B14.
    The manufacturing method according to clause B13,
wherein forming the anodic oxide film comprises immersing
a cathode and the electrode as an anode in an electrolytic
solution and applying a DC voltage between the anode and
the cathode.
Clause B15.
    The manufacturing method according to clause B14,
wherein an alkaline solution is used as the electrolytic
solution.

The invention claimed is:
1. A semiconductor device comprising:
    a semiconductor element;
    a bonding target electrically connected to the semiconductor element;
    a first wire made of a first metal, the first wire including:
        a first bonding portion bonded to the bonding target;
            and
        a first line portion extending from the first bonding
            portion;
    a wire strip made of the first metal and bonded to the
        bonding target; and
    a second wire made of a second metal different from the
        first metal, the second wire including:
        a second bonding portion fixed to the bonding target via
            the wire strip made of the first metal, the second
            bonding portion being bonded to the wire strip; and
        a second line portion extending from the second bonding portion.
2. The semiconductor device according to claim 1,
wherein the second bonding portion is spaced apart from the
bonding target.
3. The semiconductor device according to claim 1,
wherein each of the first bonding portion and the wire strip
is bonded by wedge bonding using a wedge tool, and each
of the first bonding portion and the wire strip has a press
trace formed during the bonding.
4. The semiconductor device according to claim 3,
wherein the wire strip has a substantially same shape as that
of the first bonding portion.
5. The semiconductor device according to claim 1,
wherein the second bonding portion is a ball bonding portion
bonded by ball bonding.
6. The semiconductor device according to claim 1,
wherein the second bonding portion is a stitch bonding
portion bonded by stitch bonding.
7. The semiconductor device according to claim 6,
wherein the wire strip has an elongated shape, and
    a direction in which the second line portion extends from
        the stitch bonding portion is identical with a longitudinal direction of the wire strip.
8. The semiconductor device according to claim 1,
wherein a bonding strength between the bonding target and
each of the first wire and the wire strip is greater than a
bonding strength, in a case where the second wire is directly
bonded to the bonding target, between the bonding target
and the second wire, and
    a bonding strength between the wire strip and the second
        wire is greater than a bonding strength, in a case where
        the second wire is directly bonded to the bonding
        target, between the bonding target and the second wire.
9. The semiconductor device according to claim 1,
wherein the first wire has a wire diameter that is larger than
a wire diameter of the second wire.
10. The semiconductor device according to claim 1,
wherein the bonding target includes a first bonding target
portion and a second bonding target portion, the first bonding portion being bonded to the first bonding target portion,
the second bonding portion being bonded to the second
bonding target portion via the wire strip, and
    the first bonding target portion and the second bonding
        target portion have respective outermost layers that are
        made of a same material.
11. The semiconductor device according to claim 10,
wherein the first bonding target portion and the second
bonding target portion each are plated with nickel.

12. The semiconductor device according to claim 11, wherein the first metal is mainly composed of aluminum, and the second metal is mainly composed of gold or copper.

13. A method for manufacturing a semiconductor device, comprising:

forming a wire strip by bonding a part of a first wiring material to a bonding target, the first wiring material being made of a first metal, forming a first wire by using the first wiring material, the first wire including a first bonding portion bonded to the bonding target and a first line portion extending from the first bonding portion, and forming a second wire by using a second wiring material made of a second metal different from the first metal, the second wire including:
a second bonding portion bonded to the wire strip made of the first metal; and
a second line portion extending from the second bonding portion.

14. The manufacturing method according to claim 13, wherein forming the wire strip comprises forming the wire strip by using a wedge tool, the wedge tool including a wire guide, a wedge that presses the first wiring material fed by the wire guide against a bonding object, and a cutter that cuts the first wiring material, and forming the first wire comprises forming the first wire by using the wedge tool.

15. The manufacturing method according to claim 14, wherein forming the wire strip comprises:

applying ultrasonic vibration with a part of the first wiring material pressed against the bonding target with the wedge to bond the part of the first wiring material to the bonding target, and cutting the first wiring material so as to leave the part of the first wiring material to form the wire strip.

16. The manufacturing method according to claim 13, wherein forming the second wire comprises:

forming the second bonding portion by melting the second wiring material projecting from a tip of a capillary to form a molten ball and pressing the molten ball against the wire strip for bonding;

forming the second bonding line by moving the capillary after the forming the second bonding portion while allowing the second wiring material to be drawn from the capillary; and pressing the second wiring material after the forming the second bonding portion against the semiconductor element for bonding.

17. The manufacturing method according to claim 13, wherein forming the second wire comprises:

melting the second wiring material projecting from a tip of a capillary to form a molten ball and pressing the molten ball against the semiconductor element for bonding;

forming the second line portion by moving the capillary after the melting the second wiring material while allowing the second wiring material to be drawn from the capillary; and forming the second bonding portion by pressing the second wiring material after the forming the second line portion by moving the capillary against the wire strip for bonding.

18. The manufacturing method according to claim 17, wherein the wire strip has an elongated shape, and forming the second wire comprises forming the second wire in such a manner that a direction in which the second line portion extends form the second bonding portion is identical with a longitudinal direction of the wire strip.

19. The manufacturing method according to claim 13, wherein, the first metal is made of a metal that has a bonding strength with the bonding target that is greater than a bonding strength between the second metal and the bonding target and that has a bonding strength with the second metal that is greater than a bonding strength between the second metal and the bonding target.

20. The manufacturing method according to claim 13, wherein the first wire has a wire diameter that is larger than a wire diameter of the second wire.

21. The manufacturing method according to claim 13, wherein the bonding target includes a first bonding target portion and a second bonding target portion, the first bonding portion being bonded to the first bonding target portion, the second bonding portion being bonded to the second bonding target portion via the wire strip, and the first bonding target portion and the second bonding target portion have respective outermost layers that are made of a same material.

22. The manufacturing method according to claim 21, further comprising plating both the first bonding target portion and the second bonding target portion with nickel.

23. The manufacturing method according to claim 22, wherein a metal mainly composed of aluminum is used as the first metal, and a metal mainly composed of gold or copper is used as the second metal.

* * * * *